United States Patent [19]
Isobe

[11] Patent Number: 6,099,577
[45] Date of Patent: Aug. 8, 2000

[54] LOGIC CIRCUIT CONVERSION METHOD AND LOGIC CIRCUIT DESIGN SUPPORT DEVICE

[75] Inventor: Shozo Isobe, Kawasaki, Japan

[73] Assignee: Kabushiki Kaisha Toshiba, Kawasaki, Japan

[21] Appl. No.: 09/076,847

[22] Filed: May 13, 1998

[30] Foreign Application Priority Data

May 13, 1997 [JP] Japan ................................ 9-122509

[51] Int. Cl.[7] .................................................. G06F 17/50
[52] U.S. Cl. ................................ 716/2; 716/7; 703/14
[58] Field of Search .................... 395/500.08, 500.35, 395/500.04; 716/2, 7; 703/14

[56] References Cited

U.S. PATENT DOCUMENTS

| | | | |
|---|---|---|---|
| 4,656,592 | 4/1987 | Spaanenburg et al. | 395/500.08 |
| 5,469,367 | 11/1995 | Puri et al. | 395/500.19 |
| 5,557,531 | 9/1996 | Rostoker et al. | 395/500.02 |
| 5,841,967 | 11/1998 | Sample et al. | 714/33 |

OTHER PUBLICATIONS

Comet: a set of global transformation algorithms for high–level pipeline synthesis; IEEE Proc. Int. Symp. VLSI Tech.; pp. 49–53, 1993.

Primary Examiner—Kevin J. Teska
Assistant Examiner—Hugh Jones
Attorney, Agent, or Firm—Oblon, Spivak, McClelland, Maier & Neustadt, P.C.

[57] ABSTRACT

A logic circuit simulation device comprises a connection analyzer for detecting circuit connection data from an input logic circuit description, an asynchronous element detector for detecting an asynchronous element in the input logic circuit description, a grouping area determination section for determining a grouping area in the logic circuit from which the asynchronous element is excluded, a grouping section for executing grouping for the determined grouping area, and a simulator for simulating operation of a logic circuit on the basis of the logic circuit having undergone grouping. This prevents a single event execution unit from being repeatedly executed within one simulation cycle. Since signal processing associated with the transfer of values between event execution units is replaced with variable processing, high-speed processing can be performed. Since the number of event execution units decreases, the number of times an event execution unit is registered in an event queue and a registered event is extracted from the event queue decreases.

10 Claims, 30 Drawing Sheets

```
p1:process(A,B)
begin
    F <= A and B;
end process;

p2:process(C,D)
begin
    G <= C and D;
end process;

p3:process(F,E)
begin
    if E = '1' then
        H <=F;
    end if;
end process;

p4:process(F,G)
begin
    I <= F or G;
end process;

p5:process(H,I)
begin
    X <= H and I;
end process;
```

```
p_m1:process(A,B,C,D,H)
   variable G,I,F_var:bit;
begin
   F_var := A AND B;
   F <= F_var;
   G := C and D;
   I := F_var or G;
   X <= H and I;
end process;

p3:process(F,E)
begin
   if E = '1' then
      H <= F;
   end if;
end process;
```

```
p1:process(A,F)
begin
   D <= A or F;
end process;

p2:process(B,D)
begin
   E <= B and D;
end process;

p1:process(C,E)
begin
   F <= C and E;
end process;
```

```
p1:process(A,B,C)
begin
   C <= A and B;
   D <= C;
end process;
```
FIG. 13
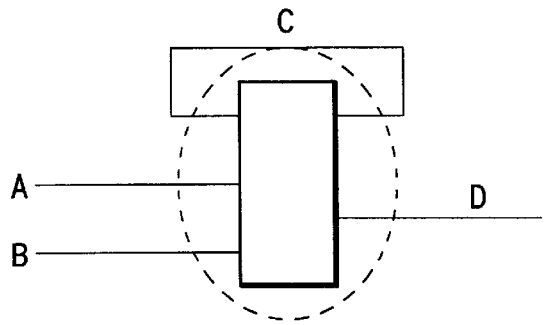
FIG. 14
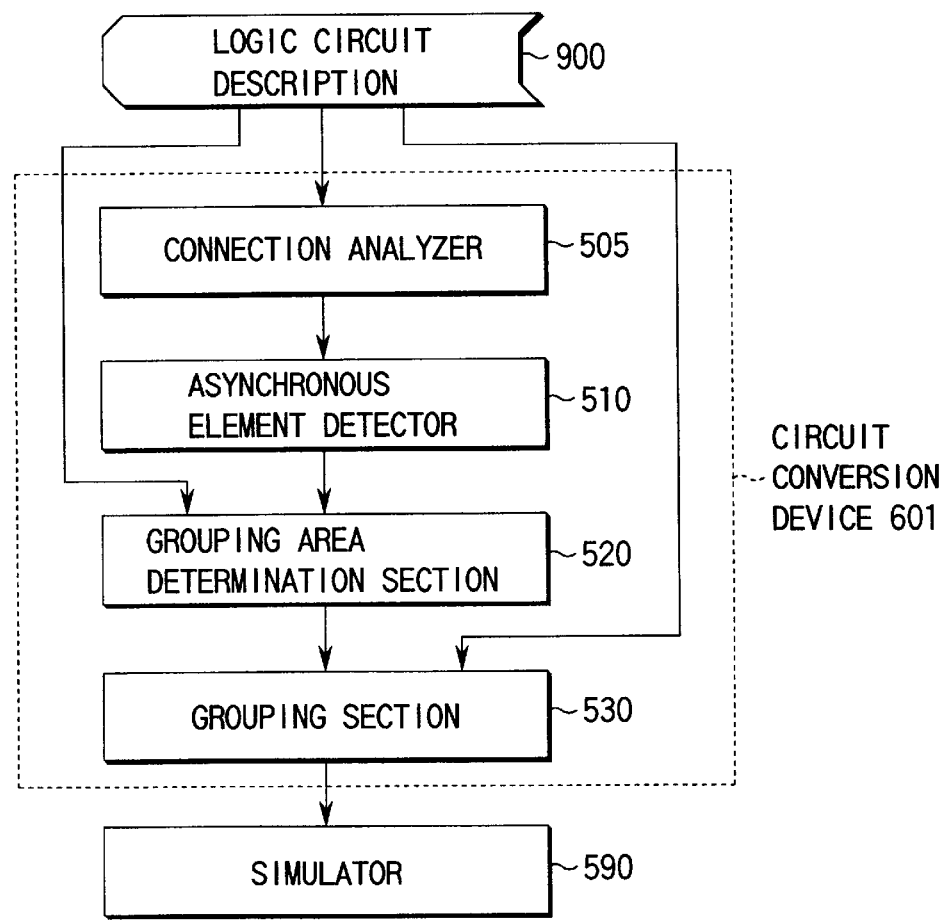
FIG. 15

```
p_m2:process(A,B,C,D)
   variable G,F_var:bit;
begin
   F_var := A and B;
   F <= F_var;
   G := C and D;
   I := F_var or G;
end process;

p3:process(F,E)
begin
   if E = '1' then
      H <= F;
   end if;
end process;

p5:process(H,I)
begin
   X <= H and I;
end process;
```

```
p1:process(A,B)
begin
   F <= A and B;
end process;

p2:process(C,D)
begin
   G <= C and D;
end process;

p3a:process(F,E,T)
begin
   T <= F and E;
   H <= not T;
end process;

p4:process(F,G)
begin
   I <= F or G;
end process;

p5:process(H,I)
begin
   X <= H and I;
end process;
```

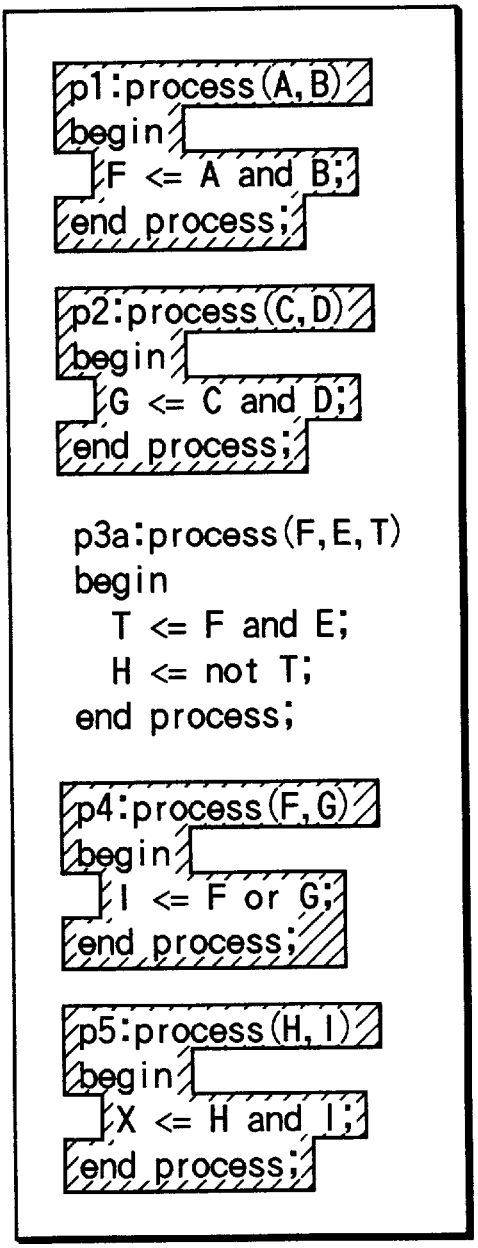

```
p1:process(A,B)
begin
   F <= A and B;
end process;

p2:process(C,D)
begin
   G <= C and D;
end process;

p3a:process(F,E,T)
begin
   T <= F and E;
   H <= not T;
end process;

p4:process(F,G)
begin
   I <= F or G;
end process;

p5:process(H,I)
begin
   X <= H and I;
end process;
```

FIG. 27

```
p1:process(A,B)
begin
   F <= A and B;
end process;

p2:process(C,D)
begin
   G <= C and D;
end process;

p31:process(F,E)
begin
   T <= F and E;
end process;

p32:process(T)
begin
   H <= not T;
end process;

p4:process(F,G)
begin
   I <= F or G;
end process;

p5:process(H,I)
begin
   X <= H and I;
end process;
```

FIG. 28

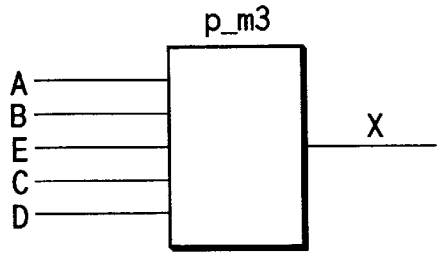
FIG. 31
```
p_m3:process(A,B,C,D,E)
   variable F,G,T,H,I:bit;
begin
   F := A and B;
   G := C and D;
   T := F and E;
   I := F or G;
   H := not T;
   X <= H and I;
end process;
```
FIG. 32
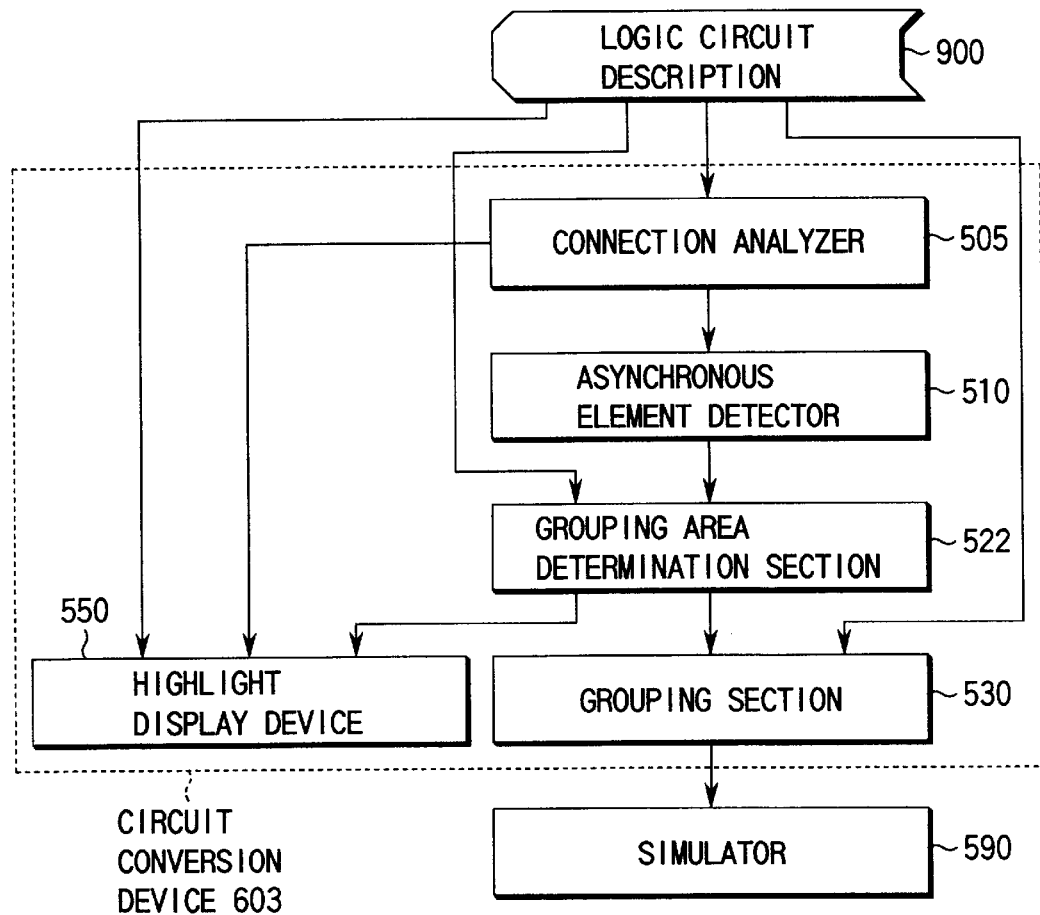
FIG. 33

```
p01:process(CLK)
begin
   if(CLK' event and CLK= '1' )then
     A <= X;
     B <= not X;
   end if;
end process;

p02:process(CLK)
begin
   if(CLK' event and CLK= '1' )then
     C <= X;
   end if;
end process;

p1:process(A,B)
begin
     D <= A and B;
end process;

p2:process(B,C)
begin
   if B= '1'  then
     E <= C;
   end if;
end process;

p3:process(E,D)
begin
     X <= E or D;
end process;
```

```
p01    REGISTER
p02    REGISTER
p1     COMBINATION CIRCUIT
p2     LATCH
p3     COMBINATION CIRCUIT
```
FIG. 38
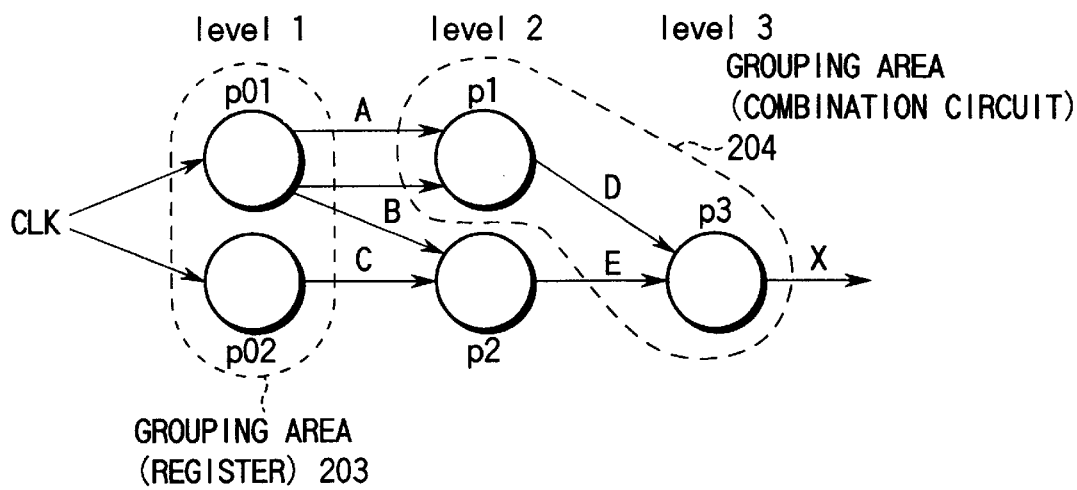
FIG. 39
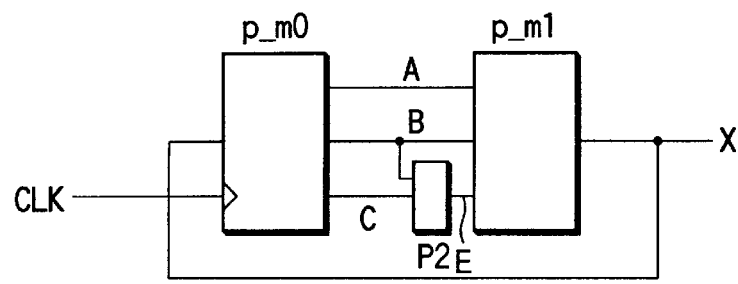
FIG. 40

```
p_m0:process(CLK)
begin
   if (CLK' event and CLK= '1' ) then
      A <= X;
      B <= not X;
      C <= X;
   end if
end process;

p2:process(B,C)
begin
   if B= '1' then
      E <= C;
   end if;
end process;

p_m1:process(A,B,E)
   variable D:bit;
begin
      D := A and B;
      X <= E orD;
end process;
```

```
C = ! A;
D = ! B;
E = A & B;
F = C & D;
G = E || F;
```

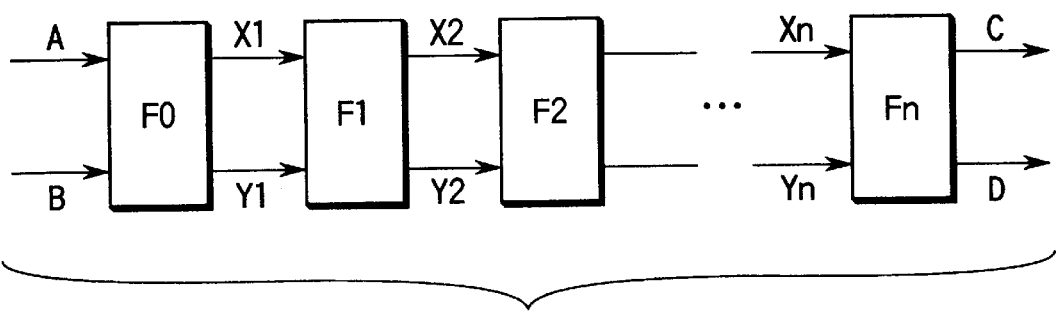
FIG. 49
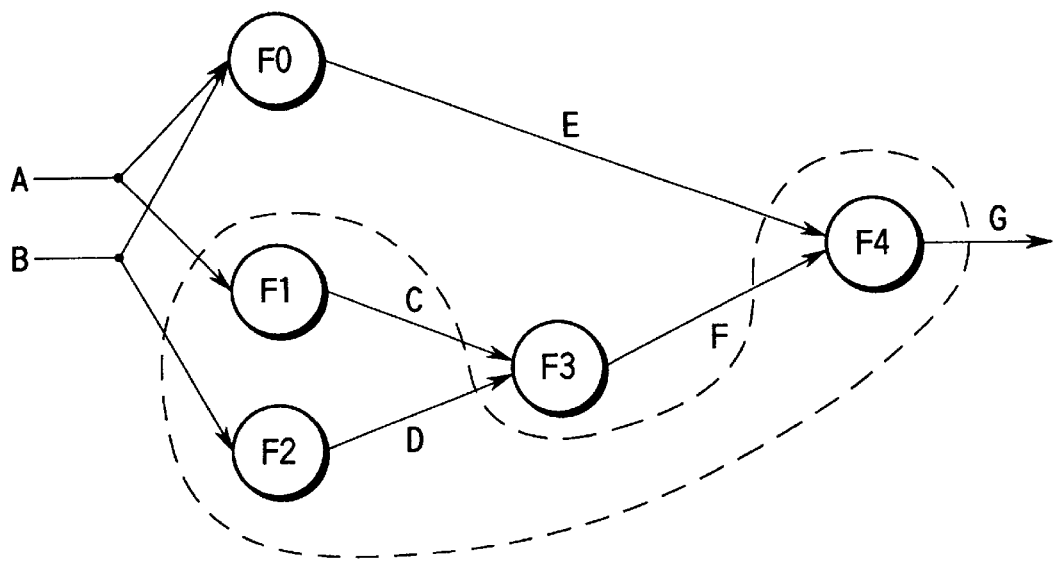
FIG. 50
FIG. 51

LOGIC CIRCUIT CONVERSION METHOD AND LOGIC CIRCUIT DESIGN SUPPORT DEVICE

BACKGROUND OF THE INVENTION

The present invention relates to a logic circuit conversion method for a digital logic circuit and a logic circuit design support device as a logic simulation device using the method.

In designing a computer system or LSI, detecting design logic deficiencies in the early stage by verifying the designed circuit by means of logic simulation is indispensable for shortening the time required for development.

On the other hand, with the recent increase in the integration degree of LSIs, LSIs and computer systems including them as constituent elements have increased in size and complexity more and more. The time required for logic simulation increases in proportion to the size of a circuit to be verified. The execution speed of a conventional logic simulator is about several clocks/sec with respect to a 100K gate circuit. Since the execution speed decreases in inverse proportion to the circuit size, a 1M gate circuit can only be processed at one clock/sec or less. Therefore, it takes much time to simulate a large-scale circuit. It is therefore difficult to perform design verification of a large-scale LSI by simulation using a sufficient long test vector. Considering a case wherein faults are found after an LSI is manufactured, in particular, the time required for correction, re-verification, development, and the like of design logic greatly increases, so does the cost. Under the circumstances, the designers demand higher-speed logic simulators.

A logic simulator is generally implemented by software. Many logic circuits to be verified by the logic simulator implemented by software are expressed by a language suited for the execution of software. For example, this language is a high-level language typified by the C language and an assembly language. When these languages are used, the value of each signal in a logic circuit is expressed by a variable, and the propagation of signals between logic circuits is described by signal assignment statements for the variables corresponding to the signals. The logic simulator executes these signal assignment statements in each simulation cycle to simulate signal processing in the circuit. Many logic simulators designed to receive logic circuit description described in a hardware description language (HDL) such as VHDL or Verilog-HDL have recently developed. Most of these logic simulators are designed to execute simulation after internally converting an input circuit description into a circuit description written in the C language or an assembly language. Such a simulator is intended to increase the simulation speed by devising a scheme of conversion to a computer language or optimizing a converted description. An increase in simulation speed intended by the logic simulator of this type depends on techniques in HDL processing schemes, but makes no contribution to a reduction in the processing amount required for simulation of a circuit.

An exhaust method is one of the logic simulation methods. In this method, signal assignment statements are sequentially executed in each simulation cycle. When a series of signal assignment statements is executed, it is checked whether the signal value of each signal is equal to that before the execution of corresponding signal assignments sentence. If any one of the signals has changed its signal value, a series of signal assignment statements is executed again. When all the signal values are determined by repeating this processing, the next simulation cycle starts.

In the exhaust method, however, even if an input signal value does not change, a series of signal assignments is executed, resulting in wasteful computation.

In a general logic circuit, signals occurring events are about 10% of the entire circuit. As described above, according to the exhaust method, since wasteful signal assignments increase in amount, simulation efficiency decrease.

A simulator based on an event-driven method has been developed as a logic simulator that solves the above problem. The event-driven method is a method of dividing a circuit into processing units having an appropriate size, and executing each processing unit only when any of corresponding input signals changes in value (event is occurred). A signal value is used for propagating a value between event execution units (processing units based on the event-driven method). The following is a general simulation execution sequence in the event-driven method.

(Step 1) A circuit is initialized.

(Step 2) A signal occurs an event.

(Step 3) An event execution unit to which each signal occurring an event is to be output is registered in an event queue.

(Step 4) The event execution unit registered in the event queue is evaluated. If a new event has occurred, the flow returns to Step 3.

(Step 5) The flow waits until the next event occurs, and returns to Step 2. If such an event does not occur, the sequence is ended.

When an each event execution unit is a small-scale circuit, a plurality of input signals to a given event execution unit are often evaluated in different event execution units. In such a case, if the event occurring timings of the respective input signals shift from the proper timings, a single event execution unit is repeatedly evaluated within one simulation cycle. This also increases the signal processing amount associated with the propagation of values between event execution units and the number of times an event execution unit is registered in an event queue or a registered event is extracted from the event queue.

As described above, if each event execution unit is a small-scale circuit, the processing amount required for simulation increases.

In general, a circuit described at a register transfer level (RTL) based on logical synthesis is constituted by many portions allowing parallel execution, which serve as processing function units each having an appropriate size. In addition, in describing a gate-level circuit, a small circuit element such as an AND or OR gate is handled as a unit. Therefore, a circuit described at the RTL or gate level requires a signal processing amount much larger than that required by a circuit at the behavioral level, which is not based on logic synthesis. It therefore takes much time to simulate such a circuit.

In this method, processing functions each having an appropriate size are regarded as event execution units, and a signal assignment in a given event execution unit is performed only when any of input signals to the corresponding processing function undergoes an event. Determination of a specific event execution unit to be executed in the current simulation cycle is managed by a time wheel or event queue.

As described above, according to the event-driven method, efficient simulation can be realized without performing wasteful signal assignment processing, unlike the exhaust method.

In the event-driven method, however, the overheads accompanying event management are heavy because the processing for event management is complicated. Event management is generally realized by using an event queue. In this case, the following operations are required:

a) extracting an event execution unit from the event queue;

b) checking whether a given signal has occurred an event;

c) scanning the event execution unit started by that signal; and d) registering the scanned event execution unit in the event queue.

To implement these operations, the program for the logic simulator using the event-driven method inevitably becomes complicated. In addition, the overheads associated with the time required for the execution of these operations are heavy.

Furthermore, if event execution units described in a logic circuit have inappropriate sizes, wasteful signal assignment processing is performed even in the event-driven method as in the exhaust method.

As described above, a logic simulator using the conventional exhaust method or event-driven method cannot always execute efficient simulation. This is because, the conventional logic simulator executes the signal processing flow described in an input logic circuit description, just as it is, resulting in overheads associated with the execution of unnecessary signal assignment processing. A circuit described at the RTL or gate level requires a signal processing amount much larger than that required by a circuit at the operation level, which is not based on logic synthesis. However, an increase in logic simulation speed in the prior art depends on techniques in an HDL processing scheme, but makes no contribution to a reduction in processing amount in a circuit description as in the above case. If, therefore, a circuit described at the RTL or gate level is to be simulated by the event-driven method, much time is spent to execute simulation.

In addition, the conventional logic simulator executes the signal processing flow in an input logic circuit description, just as it is, resulting in overheads that unnecessary signal assignment processing is executed.

BRIEF SUMMARY OF THE INVENTION

Accordingly, it is an object of the present invention to provide a logic circuit conversion method which can shorten the time required for simulation by converting a circuit description into a circuit description requiring a smaller signal processing amount even if each event execution unit is a small-scale circuit.

It is another object of the present invention to provide a logic circuit design support device using the above method.

It is still another object of the present invention to provide a logic circuit conversion method which can shorten the time required for simulation by reducing unnecessary signal assignment processing in simulation.

It is still another object of the present invention to provide a logic circuit design support device using the above method.

According to the present invention, there is provided a logic circuit conversion method comprising the following steps of detecting circuit connection data of an input logic circuit; detecting an asynchronous element in the input logic circuit; determining a grouping area on the basis of an area from which the asynchronous element in the logic circuit is excluded; and grouping the determined area.

In the method, the circuit connection data detecting step comprises the substep of analyzing an activation relationship between event execution units, which is a connection relationship between the event execution units and signals, and the grouping area determining step comprises the following substeps of assigning levels to the respective event execution units in the ascending order of longest paths from an input side; and setting the event execution units as grouping candidates in the ascending order of levels, and the grouping step comprises the following substeps of grouping the candidates in the ascending order of levels into one event execution unit; and immediately substituting a variable for an input signal between event execution units.

In the method, the grouping area determining step comprises the following substeps of specifying an area; and determining a grouping area within the specified area on the basis of the area from which the asynchronous element in the logic circuit is excluded.

In the method, the asynchronous element detecting step comprises a following substep of detecting a latch, a process including a self-loop, a process incapable of logic synthesis, or a process including asynchronous loop.

In the method, the grouping area determining step comprises the following substeps of judging a function of each circuit constituent element; and setting constituent elements having the same function in one area.

In the method, the grouping area determining step comprises the following substeps of judging whether a function of a circuit constituent element corresponds one of to a register, a clock generating circuit, a latch, and a combination circuit; and excluding the register from the grouping area.

According to the present invention, there is provided a logic circuit conversion support method comprising the following steps of detecting circuit connection data of an input logic circuit; detecting an asynchronous element in the input logic circuit; determining a grouping area on the basis of an area from which the asynchronous element in the logic circuit is excluded; and displaying the determined grouping area and a remaining area such that the areas can be visually discriminated from each other.

In the support method, the displaying step comprises a substep of highlighting the grouping area.

In the support method, the displaying step comprises a substep of highlighting the asynchronous element.

According to the present invention, there is provided another logic circuit conversion method comprising the following steps of detecting circuit connection data of an input logic circuit; detecting an asynchronous element in the input logic circuit; analyzing a signal processing flow in an area from which the asynchronous element in the logic circuit is excluded; determining a portion, in the input logic circuit, in which event judgment logic is to be inserted, on the basis of the signal processing flow detection result; and inserting the event judgment logic in the insert portion, in the input logic circuit, which is determined in the step of determining.

In the other conversion method, the signal processing flow analyzing step comprises a substep of detecting data of a dependence relationship between a signal and a logic processing unit.

In the other conversion method, the portion determining step comprises a substep of determining, as insert portions, start and end portions of a closed group, of logic processing unit groups, which has no path going outside the group and entering the group again and in which the number of times of signal assignment processing is large as compared with the number of input signals.

In the other conversion method, the portion determining step comprises the following substeps of inputting an event occurrence frequency of each signal; and determining a portion exhibiting a low occurrence frequency as an insert portion.

According to the present invention, there is provided a logic circuit conversion support device comprising means for detecting circuit connection data of an input logic circuit; means for detecting an asynchronous element in the input logic circuit; means for determining a grouping area on the basis of an area from which an area detected as the asynchronous element in the logic circuit is excluded; means for grouping the determined area; and means for simulating operation of a logic circuit on the basis of a logic circuit having undergone grouping.

In the device, the grouping area determining means comprises means for specifying an area; and means for determining a grouping area within the specified area on the basis of the area from which the area detected as the asynchronous element in the logic circuit is excluded.

According to the present invention, there is provided a logic circuit conversion support device comprising means for detecting circuit connection data of an input logic circuit; means for detecting an asynchronous element in the input logic circuit; means for analyzing a signal processing flow in an area from which the asynchronous element in the logic circuit is excluded; means for determining a portion, in the input logic circuit, in which event judgment logic is to be inserted, on the basis of the signal processing flow detection result; and means for inserting the event judgment logic in the insert portion, in the input logic circuit, which is determined in the step of determining.

According to the present invention, the determination means determines a grouping area on the basis of circuit connection data which is analyzed by the analyzing means and from which the asynchronous element is excluded by the asynchronous element detecting means, and the grouping means executes grouping for the determined area, thereby converting the input logic circuit description into a logic circuit description having undergone optimal grouping. With this logic circuit description having undergone optimal grouping, high-speed logic simulation can be executed.

According to the present invention, an asynchronous element is excluded from the result obtained by analyzing the signal processing flow in an input logic circuit description, and event judgment logic is inserted in a portion determined on the basis of the resultant data. With this processing, the input logic circuit description can be converted into a logic circuit description which can omit the execution of a logic processing portion which need not be essentially executed when no event occurs. With the logic circuit description having this event judgment logic inserted therein, high-speed logic simulation can be executed.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 13 is a view showing a VHDL description of still another example of an asynchronous element;

FIG. 14 is a circuit diagram corresponding to the VHDL description in FIG. 13;

FIG. 15 is a block diagram showing the arrangement of a logic simulation device according to the first embodiment;

FIG. 27 shows still another example of a highlight display of a grouping area in the third embodiment;

FIG. 28 is a view showing a VHDL description of an input circuit description obtained after rewriting by the user who saw the highlight display in the third embodiment;

FIG. 31 is a block diagram showing a signal grouping area determination result in the third embodiment;

FIG. 32 is a block diagram showing a logic circuit conversion result in the third embodiment;

FIG. 33 is a circuit diagram showing the arrangement of a logic simulation device according to the third embodiment;

FIG. 38 is a view showing function data of event execution units in the fourth embodiment;

FIG. 39 is a view showing a grouping area determination result in the fourth embodiment;

FIG. 40 is a block diagram showing a logic circuit conversion result in the fourth embodiment;

FIG. 49 is a view showing a logic circuit description in which the event judgment logic is inserted in the fifth embodiment;

FIG. 50 is an example of a logic circuit description input to the fifth embodiment;

FIG. 51 is an example of a circuit that does not meet an event judgment logic insert condition;

DETAILED DESCRIPTION OF THE INVENTION

A preferred embodiment of a logic circuit conversion method and logic conversion support device according to the present invention will now be described with reference to the accompanying drawings.

(First Embodiment)

A logic circuit conversion device according to the first embodiment comprises a connection analyzer for analyzing circuit connection data, an asynchronous element detector for detecting an asynchronous element in a logic circuit on the basis of the circuit connection data, a grouping area determination section for determining a grouping area (to which grouping is applied) excluding the asynchronous element, and a grouping section for executing grouping for the determined area.

According to this embodiment, grouping can be executed for a limited grouping area excluding an asynchronous element. A circuit description having undergone grouping can be obtained from an input asynchronous circuit description. High-speed logic simulation can be realized by inputting the corresponding description having undergone grouping to a logic simulator.

In this specification, a synchronous element is a circuit element whose level or evaluation timing can be statically determined when level assignment is performed in the ascending order of longest paths measured from the input side. An asynchronous element is a circuit element, such as a latch, a combination circuit forming an asynchronous loop, or an event execution unit including a self-loop, whose level or evaluation timing cannot be statically determined when level assignment is performed in the ascending order of longest paths, or a circuit element whose level dynamically changes in accordance with the input timing of a signal because of different output operations.

The first embodiment will be described detail below.

Figure 1:
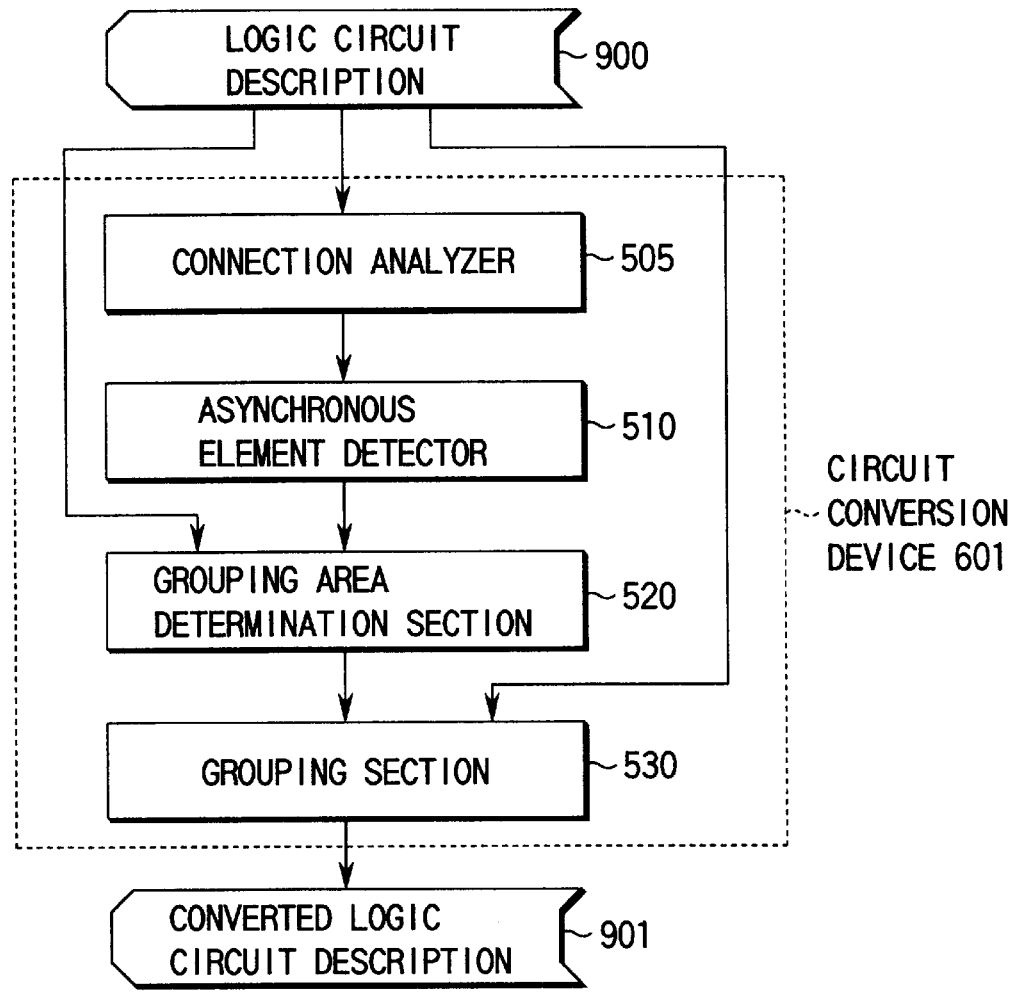
FIG. 1 is a block diagram showing an example of the arrangement of a logic circuit conversion device according to the first embodiment of the present invention.

FIG. 1 is a block diagram showing the arrangement of a logic circuit conversion device 601 according to the first embodiment.

The logic circuit conversion device 601 comprises a connection analyzer 505, an asynchronous element detector 510, a grouping area determination section 520, and a grouping section 530.

The connection analyzer 505 analyzes the activation relationship between event execution units (processing units based on the event-driven method), i.e., the connection relationship between the event execution units and signals (the dependence relationship between the logic processing units through the signals), as the circuit connection data in an input logic circuit description 900.

The asynchronous element detector 510 detects an asynchronous element in the event execution units (the processing units based on the event-driven method) in the input logic circuit description 900.

The grouping area determination section 520 determines specific event execution units in the logic circuit description 900 and a specific grouping sequence by which optimal grouping can be realized in an area from which the event execution unit detected as the asynchronous element in the input logic circuit description 900 by the asynchronous element detector 510 is excluded, thereby determining an area including the event execution units to be grouped.

The grouping section 530 applies event execution unit grouping operation to each grouping area determined by the grouping area determination section 520, thereby performing grouping.

The logic circuit conversion method used by the logic circuit conversion device 601 according to this embodiment will be described with reference to a simple example.

Figure 2:
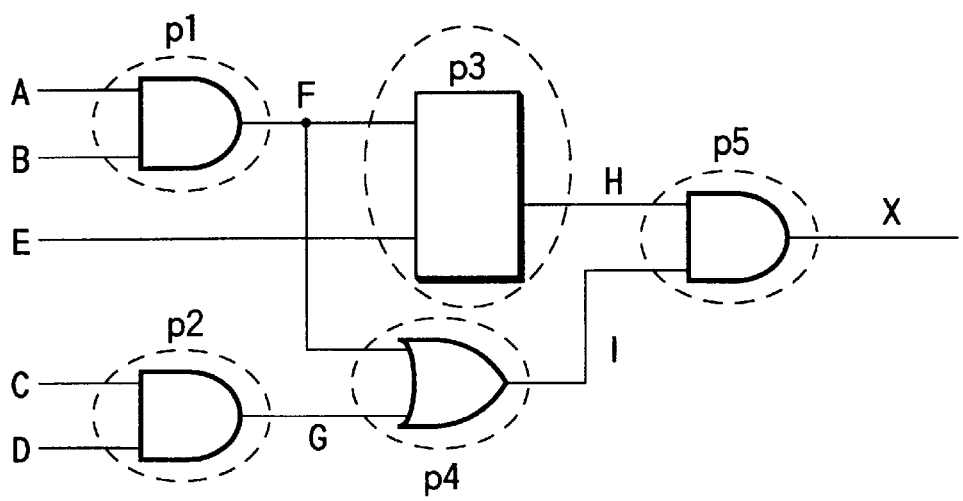
FIG. 2 is a circuit diagram showing an example of a logic circuit description input to the conversion device of the first embodiment.
Figures 3, 4:
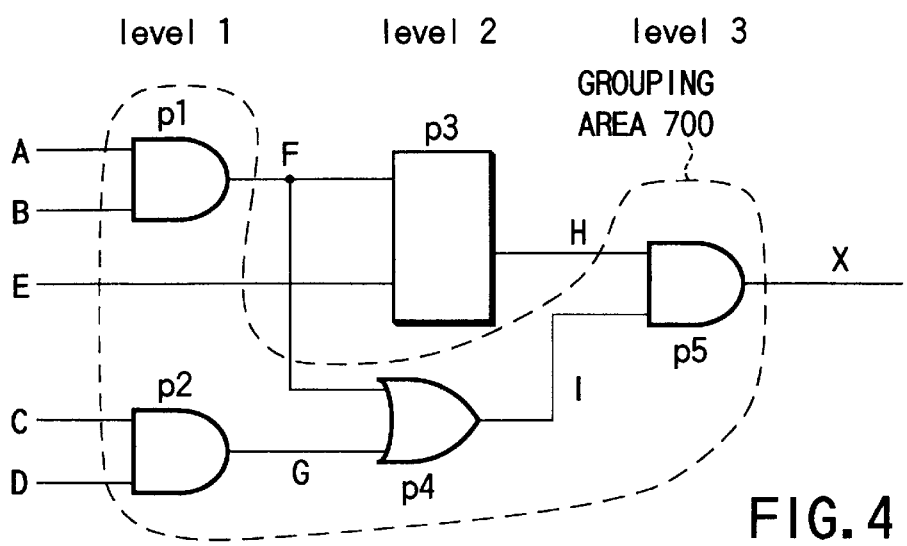
FIG. 3 is a view showing a VHDL description of logic corresponding to the circuit diagram of FIG. 2.
FIG. 4 is a circuit diagram showing a grouping area determination result in the first embodiment.

FIGS. 2 and 3 are a circuit diagram based on the input logic circuit description and a corresponding VHDL description. Reference symbols p1 to p5 denote event execution units. These units p1 to p5 correspond to circuit elements in FIG. 2; and, VHDL processes in FIG. 3. The event execution units p1, p2, and p5 are AND (logical product) gates and the event execution unit p4 is an OR (logical sum) gate. The event execution unit p3 is a latch, which holds data (operates as a register) or passes it through (operates as a combination circuit) in accordance with an input control signal value. Note that input logic circuit data may be expressed by an HDL description or netlist. In addition, the HDL used is not limited to VHDL.

When the logic circuit description 900 expressed in FIG. 2 or 3 is input to the logic circuit conversion device 601, the asynchronous element detector 510 detects the event execution unit p3, which is a latch, as an asynchronous element. The reason why a latch is judged as an asynchronous element is that the evaluation timing changes depending on which event, i.e., an input control signal or data signal, propagates first, and the execution order cannot be determined in advance.

The grouping area determination section 520 determines a grouping area from the event execution units p1, p2, p4, and p5 excluding the event execution unit p3 detected as the asynchronous element. For example, this area is determined by the following sequence:

(Step 1-1) Levels are assigned to the respective event execution units in the ascending order of longest paths from the input side.

(Step 1-2) Assume that GR represents a null group; and E, a group consisting of all the event execution units excluding the asynchronous element.

(Step 1-3) If the group E is a null group, the flow advances to Step 1-5. Otherwise, an event execution unit T having the lowest level is selected from the group E.

(Step 1-4) The event execution unit T is included in the group GR. The event execution unit T is excluded from the group E, and the flow returns to Step 1-3.

(Step 1-5) The sequence is ended. The group GR of the event execution units is the grouping area.

FIG. 4 shows an example of the result obtained by applying the above sequence to the logic circuit shown in FIG. 2.

In Step 1-1, levels 1, 1, 2, 2, and 3 are respectively assigned to the event execution units p1, p2, p3, p4, and p5. In Step 1-3 and Step 1-4, the event execution units p1, p2, p4, and p5 are included in the group GR in the order named (the units p1 and p2 may be included in an inverted order). As a result, the grouping area {p1, p2, p4, p5} is obtained (the area enclosed with a broken line 700 in FIG. 4).

The grouping section 530 sets as one event execution unit the group of event execution units in the area determined by the grouping area determination section 520. This operation can be realized by the following sequence.

(Step 1-A) The event execution units in the group obtained in Step 1-1 to Step 1-5 are arranged in the order in which they are incorporated, and set as one event execution unit.

(Step 1-B) Input signals between the event execution units in the group are replaced with variables to be instantaneously substituted. In this case, a signal which is an output to an event execution unit outside the group is left as a signal while a corresponding variable is generated.

Figures 5, 6:
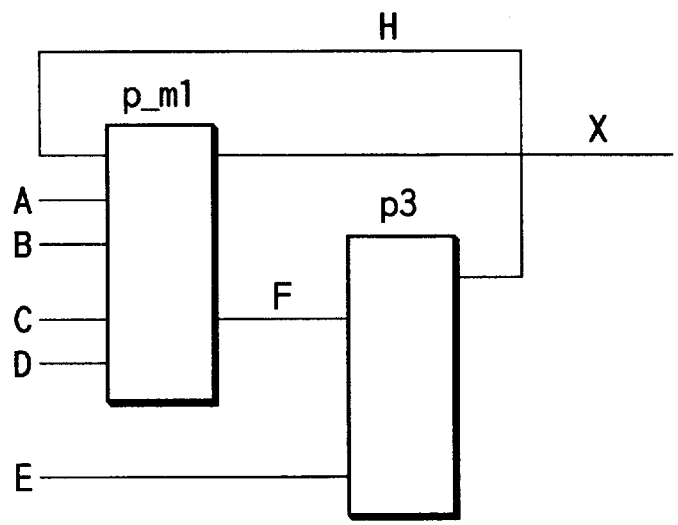
FIG. 5 is a block diagram showing a logic circuit conversion result in the first embodiment.
FIG. 6 is a view showing a VHDL description of the logic circuit conversion result in FIG. 5.

FIGS. 5 and 6 show an example of the circuit conversion result obtained by applying the above sequence to the logic circuit shown in FIG. 2.

FIG. 5 is a block diagram showing the conversion result. In Step 1-A, the group {p1, p2, p4, p5} is obtained. This group is set as one event execution unit p_m1 which receives signals A, B, C, D and H and outputs signals F and X.

FIG. 6 shows a VHDL description corresponding to the conversion result in FIG. 5. In Step 1-A, processes p1, p2, p4, and p5 are set as one process p m1. As in the case shown in FIG. 5, the signals A, B, C, D, and H are inputs, and the signals F and X are outputs. A signal G used for the propagation of a value from p2 to p4 and a signal I used for the propagation of a value from p4 to p5 are respectively replaced with variables. A signal F used for the propagation of a value from p1 to p4 is replaced with a corresponding variable F_var. The above replacement of signals with variables realizes optimal grouping.

The description having undergone grouping executed by the grouping section 530 is output as a converted logic circuit description 901.

Note that the output circuit description can be expressed by a diagram, a netlist, or an HDL. The HDL used is not limited to VHDL.

The circuit description obtained by such grouping reduces the chance that a single event execution unit is repeatedly evaluated within one simulation cycle. In addition, since signal processing associated with the propagation of values between event execution units is replaced with variable processing, high-speed processing can be performed. Furthermore, since the number of event execution units decreases, the number of times an event execution unit is registered in an event queue or a registered event is extracted from the event queue decreases. Moreover, according to this embodiment, since the event execution units in an input logic circuit description, excluding an asynchronous circuit element, are grouped, the operation of grouping event execution units does not differ from that of the original description.

According to this embodiment, therefore, even if an input logic circuit description corresponds to an asynchronous circuit which is constituted by small event execution units and requires a large signal processing amount, a circuit which reduces the processing amount required to execute simulation can be obtained.

According to the method described above, only one group corresponds to a grouping area. However, a plurality of groups can be formed as grouping areas. For example, in the following sequence, different groups may be formed on the input side and output side of an asynchronous element.

In this case, groups El and E2 are respectively a group of event execution units each having a signal value propagating on an input signal to the asynchronous element, and a group of event execution units each having a signal value propagating on an output signal from the asynchronous element.

(Step 1-1a) Levels are assigned to the respective event execution units in the ascending order of longest paths from the input side.

(Step 1-2a) The groups E1 and E2 are obtained on the basis of the activation relationship between the event execution units.

(Step 1-3a) Assume that GR1, GR2, and GR3 represent null groups; E, a group of all the event execution units excluding the asynchronous element; and E3, a group obtained by subtracting the groups El and E2 from the group E.

(Step 1-4a) If the group E is a null group, the flow advances to Step 1-6a. Otherwise, an event execution unit T having the lowest level is selected from the group E.

(Step 1-5a) If the event execution unit T is included in a group E1, the event execution unit T is included in a group GR1 (i=1, 2, 3). The event execution unit T is excluded from the group E. The flow then returns to (Step 1-4a). (Step 1-6a) The sequence is ended.

The groups GRi (i=1, 2, 3) of event execution units are grouping areas.

Figure 7:
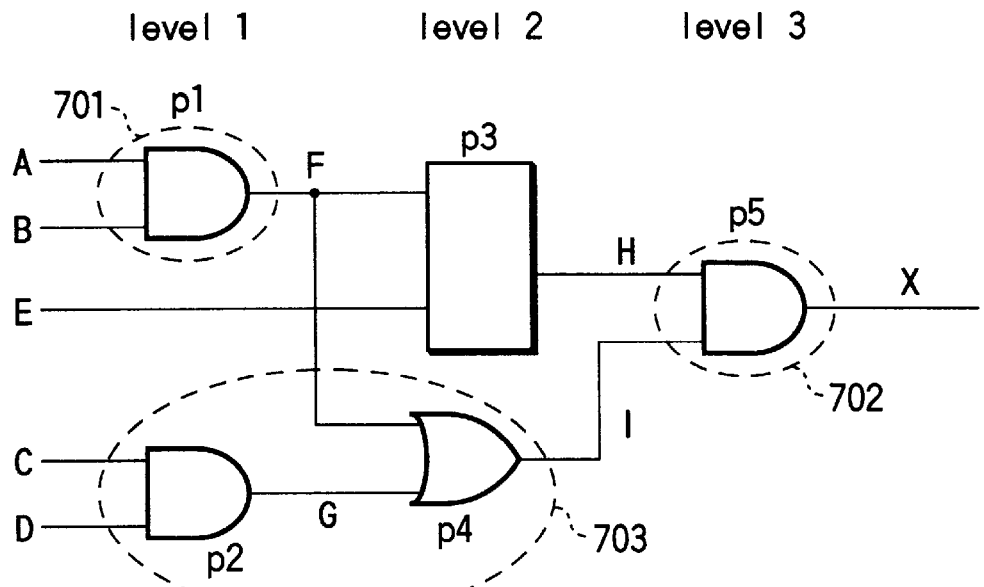
FIG. 7 is a circuit diagram showing another grouping area determination result in the first embodiment.

FIG. 7 shows an example of the result obtained by applying the above sequence to the logic circuit shown in FIG. 2.

In Step 1-2a, the groups E1 and E2 are respectively expressed by {p1} and {p5}. In Step 1-4a and Step 1-5a, the groups GR1, GR2, and GR3 are respectively expressed by {p1}, {p5}, and {p2, p4}.

Referring to FIG. 7, reference numerals 701, 702, and 703 respectively denote the groups GR1, GR2, and GR3.

In the above sequence, the group E3 may be regarded as identical to the group E1 or E2 to form two groups instead of the groups GR1, GR2, and GR3.

In the above description, for the sake of simplicity, only one asynchronous element is assumed. Even if, however, a plurality of asynchronous elements are present, the above sequence can be used in an extended form.

In the above description, the latch is used as the asynchronous element. However, a method similar to that described above can be applied to an asynchronous element other than the latch.

Figures 8, 9:
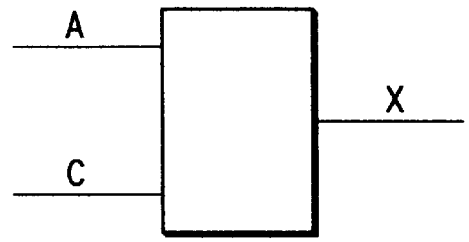
FIG. 8 is a view showing a VHDL description of an example of an asynchronous element.
FIG. 9 is a circuit diagram showing an example of a circuit diagram corresponding to the VHDL description in FIG. 8.
Figures 11, 12:
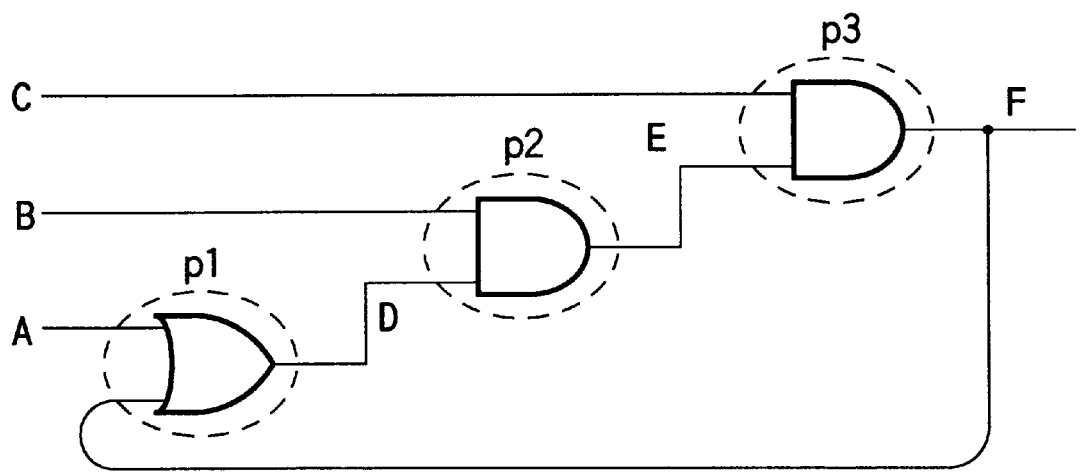
FIG. 11 is a VHDL description of another example of an asynchronous element.
FIG. 12 is a circuit diagram corresponding to the VHDL description in FIG. 11.

FIGS. 8, 11, and 13 show examples of VHDL descriptions including asynchronous elements.

Figure 10:
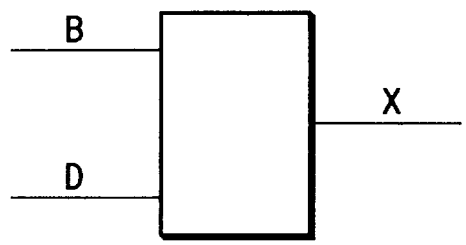
FIG. 10 is a circuit diagram showing another example of a circuit diagram corresponding to the VHDL description in FIG. 8.

The process in the description in FIG. 8 does not allow logic synthesis, and alternately has the circuit functions shown in FIGS. 9 and 10. Since the output operation for an output signal X differs depending on the input timings of signals A and B in FIGS. 9 and 10, the level dynamically changes. The process therefore becomes an asynchronous element.

According to the description in FIG. 11, since an asynchronous loop is formed, as shown in FIG. 12, the levels of all the processes as the constituent elements of the loop cannot be determined. These elements are therefore judged as asynchronous elements.

The description in FIG. 13 is a process including a self-loop. FIG. 14 is a circuit diagram equivalent to the description in FIG. 13. The level of this process is changed in accordance with the number of times this process is activated. Therefore this process is judged as an asynchronous element.

A logic simulation device serving as a logic circuit design support device having the logic circuit conversion device according to the first embodiment will be described next.

The logic simulation device according to this embodiment comprises a logic simulator 590 for executing logic simulation on the basis of an input logic circuit description, in addition to the logic a circuit conversion device 601 (constituted by the connection analyzer 505, the asynchronous element detector 510, the grouping area determination section 520, and the grouping section 530) according to the first embodiment described above, as shown in FIG. 15. As the logic simulator 590, a known simulator is used.

The logic circuit conversion device 601 converts a logic circuit description as a logic simulation target into a logic circuit description having undergone grouping and requiring a small signal processing amount. The logic simulator 590 then executes logic simulation on the basis of the converted logic circuit description as an input.

When the logic circuit conversion device 601 for performing optimal grouping for a logic circuit description is connected to the input of the logic simulator 590, a logic simulation device for executing logic simulation at high speed can be realized.

As described above, according to this embodiment, optimal grouping can be performed for a logic circuit including an asynchronous element, and high-speed logic simulation can be performed.

Other embodiments of the logic circuit conversion device according to the present invention will be described. The same portions as those of the first embodiment will be indicated in the same reference numerals and their detailed description will be omitted.

(Second Embodiment)

A logic circuit conversion device according to the second embodiment comprises a connection analyzer for analyzing circuit connection data, an asynchronous element detector for detecting an asynchronous element in a logic circuit, a grouping area specifying section for specifying a grouping area, a grouping area determination section for determining a grouping area (to which grouping is applied) excluding the asynchronous element, and a grouping section for executing grouping for the determined area.

According to this embodiment, a grouping area is determined on the basis of the area excluding the asynchronous element obtained by the asynchronous element detector and the area specified by the grouping area specifying section. The grouping section can execute grouping for the determined area. As a result, a circuit having undergone optimal grouping can be obtained from the input asynchronous circuit description. This allows grouping for an area other than an area for which the designer does not want to perform grouping (signals which are to be observed as they are).

This embodiment will be described in more detail below.

Figure 16:
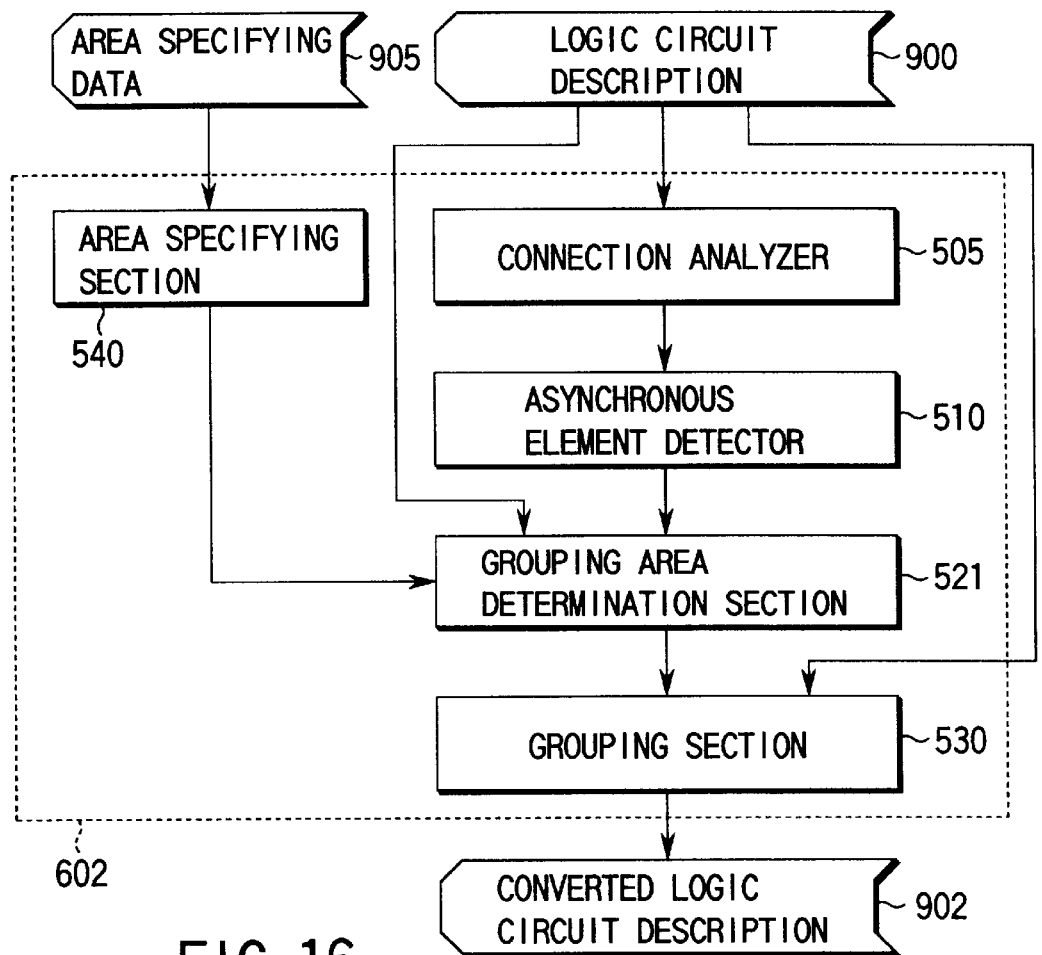
FIG. 16 is a block diagram showing the arrangement of a logic circuit conversion device according to the second embodiment of the present invention.

FIG. 16 shows the arrangement of a logic circuit conversion device 602 according to this embodiment.

The logic circuit conversion device 602 comprises the connection analyzer 505, the asynchronous element detector 510, a grouping area determination section 521, the grouping section 530, and the grouping area specifying section 540. The connection analyzer 505, the asynchronous element detector 510, and the grouping section 530 are the same as those in the first embodiment.

The connection analyzer 505 analyzes the activation relationship between event execution units (processing units based on the event-driven method), i.e., the connection relationship between the event execution units and signals (the dependence relationship between the logic processing units through the signals), as the circuit connection data in the input logic circuit description 900.

The asynchronous element detector 510 detects an asynchronous element in the event execution units (the processing units based on the event-driven method) in the input logic circuit description 900.

This embodiment differs from the first embodiment in that the user can specify an area, in a circuit, to which grouping is to be applied (or not to be applied) by inputting area specifying data 905 through the grouping area specifying section 540. As the area specifying data 905, for example, data representing an area (e.g., data p1 and p2 specifying event execution units), in the target circuit in FIG. 17, may be directly input. Alternatively, an ID number or the like corresponding to data directly representing an area may be key-input, or an area may be selectively input from a list on a displayed menu screen.

The grouping area determination section 521 determines specific event execution units in the logic circuit description 900 and a specific grouping sequence by which optimal grouping can be realized on the basis of the asynchronous element detected by the asynchronous element detector 510 and the area specified by the grouping area specifying section 540, thereby determining an area including the event execution units to be grouped.

The grouping section 530 applies event execution unit grouping operation to each grouping area determined by the grouping area determination section 521, thereby performing grouping.

The logic circuit conversion method used by the logic circuit conversion device 602 according to this embodiment will be described with reference to a simple example.

FIG. 2 is used again as a circuit diagram equivalent to an input circuit description. In this case, the input circuit description may be expressed by an HDL or netlist.

When, for example, the user wants to observe a signal I as it is, {p1, p2, p3, p4} is used as the area specifying data 905 to specify only p1, p2, p3, and p4 excluding p5.

In this case, the respective event execution units are specified by their names. However, unique IDs may be assigned to the respective event execution units, and the units may be specified by the IDs. In this case, the respective event execution units are specified one by one. Alternatively, however, a given level may be specified, and all event execution units at a given level or lower may be specified.

When the description in FIG. 2 or 3 is input to the logic circuit conversion device 602, the asynchronous element detector 510 detects the event execution unit p1 as an asynchronous element.

On the basis of the asynchronous element detected by the grouping area determination section 521, the grouping area determination section 521 determines a grouping area in which optimal grouping can be realized by grouping event execution units. For example, this area can be determined in the following steps.

(Step 2-1) Levels are assigned to the respective event execution units in the ascending order of longest paths from the input side.

(Step 2-2) Assume that GR represents a null group; and E, a group consisting of all the event execution units excluding the asynchronous element.

(Step 2-3) If the group E is a null group, the flow advances to Step 2-5. Otherwise, an event execution unit T having the lowest level is selected from the group E.

(Step 2-4) If the event execution unit T falls within the area specified by the grouping area specifying section 540, the unit T is included in the group GR. The event execution unit T is then excluded from the group E, and the flow returns to Step 2-3.

(Step 2-5) The sequence is ended.

The group GR of event execution units is the grouping area.

Figure 17:
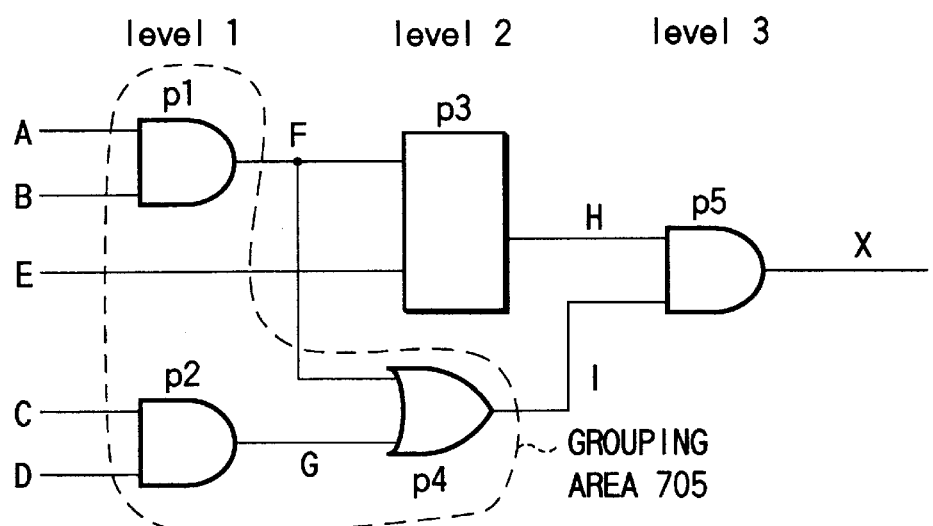
FIG. 17 is a circuit diagram showing a grouping area determination result in the second embodiment.

FIG. 17 shows an example of the result obtained by applying the above sequence to the logic circuit shown in FIG. 2.

In (Step 2-1), levels 1, 1, 2, 2, and 3 are respectively assigned to the event execution units p1, p2, p3, p4, and p5. In Step 2-3 and Step 2-4, the event execution units p1, p2, and p4 are included in the group GR in the order named. In this case, since the event execution unit p5 is not included in the area specified by the grouping area specifying section 540, the unit p5 is not included in the group GR. The grouping area is therefore expressed as {p1, p2, p4} (the area enclosed with a broken line 705 in FIG. 17).

The grouping section 530 sets as one event execution unit the group of event execution units in the area determined by the grouping area determination section 521. This operation can be performed in Step 1-A and Step 1-B.

Figures 18, 19:
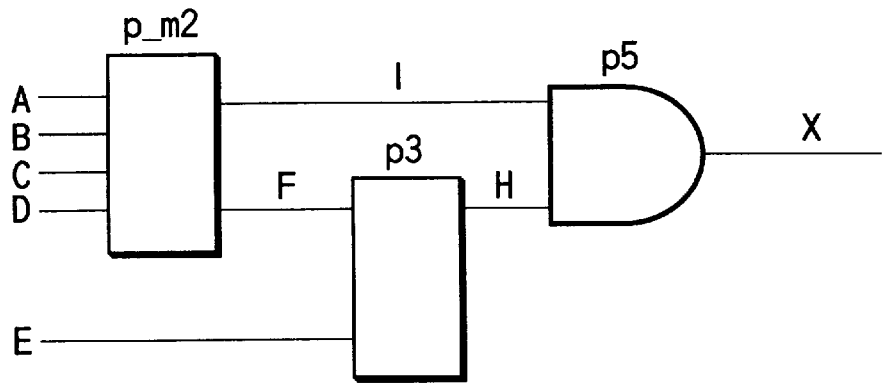
FIG. 18 is a block diagram showing a logic circuit conversion result in the second embodiment.
FIG. 19 is a view showing a VHDL description of the logic circuit conversion result in FIG. 18.

FIGS. 18 and 19 show an example of the circuit conversion result obtained by applying the above sequence to the logic circuit shown in FIG. 2.

FIG. 18 is a block diagram showing the conversion result. In Step 1-A, the group {p1, p2, p4} is obtained. In Step 1-B, this group is complied into one event execution unit p_m2 which receives signals A, B, C, and D and outputs signals F and I.

FIG. 19 shows a VHDL description corresponding to the conversion result in FIG. 18. In Step 1-A, processes p1, p2, and p4 are set as one process p_m2. As in the case shown in FIG. 18, the signals A, B, C, and D are inputs, and the signals F and I are outputs. The signal F used for the propagation of a value from p1 to p4 and a signal G used for the propagation of a value from p2 to p4 are replaced with variables. The above replacement of signals with variables realizes optimal grouping.

The description having undergone grouping executed by the grouping section 530 is output as a logic circuit description 902.

Note that the output circuit description can be expressed by a diagram, a netlist, or an HDL. The HDL used is not limited to VHDL.

According to the circuit description obtained by specifying a grouping area in this manner, grouping can be applied to the area excluding the signals to be observed by the designer. In addition, in the grouping area, a circuit which reduces the processing amount required for the execution of simulation can be obtained, as in the first embodiment.

Note that a plurality of groups can be formed as grouping areas, as in the first embodiment.

A logic simulation device serving as a logic circuit design support device having the logic circuit conversion device according to the second embodiment will be described next.

Figure 20:
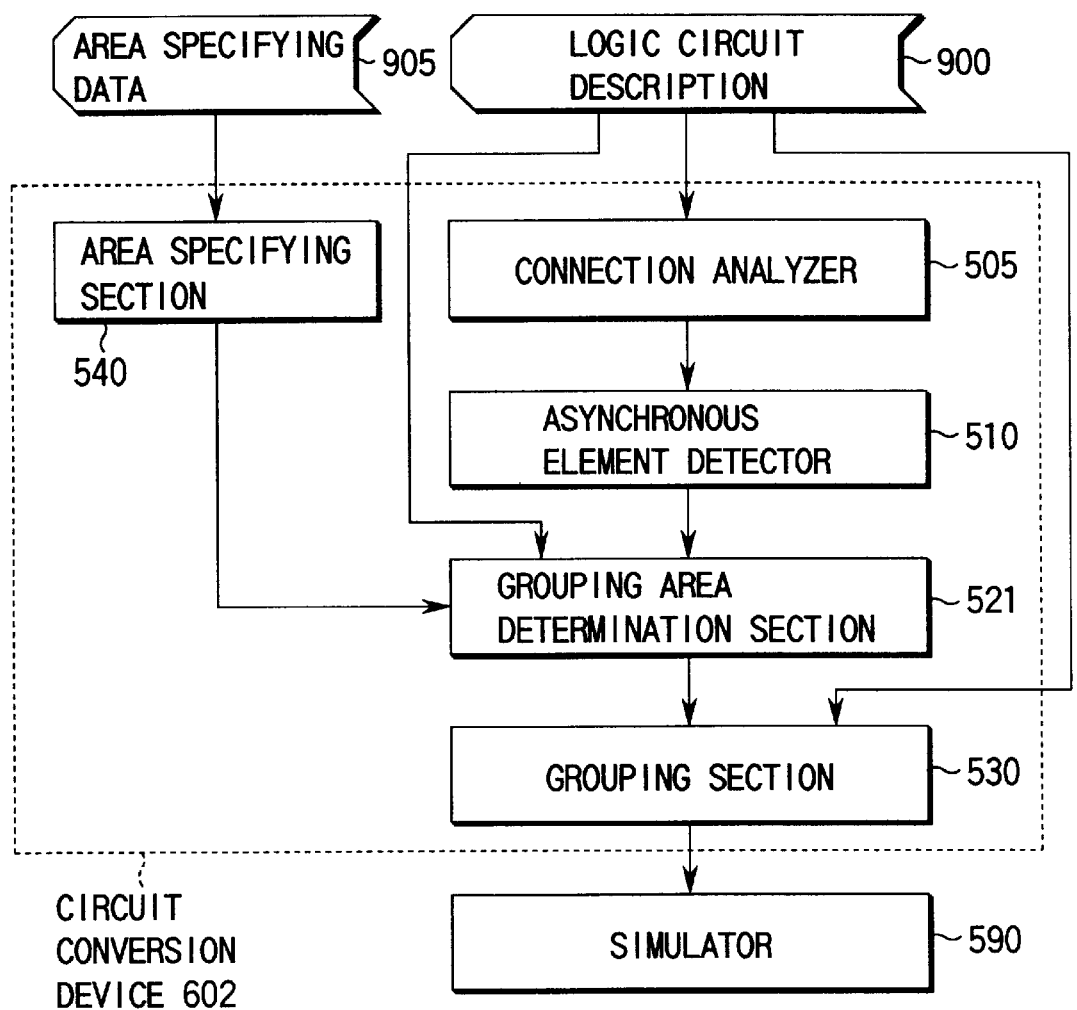
FIG. 20 is a block diagram showing the arrangement of a logic simulation device according to the second embodiment.

The logic simulation device according to this embodiment comprises a logic simulator 590 for executing logic simulation on the basis of an input logic circuit description, in addition to the logic circuit conversion device 602 (constituted by the connection analyzer 505, the asynchronous element detector 510, the grouping area determination section 521, the grouping section 530, and the grouping area specifying section 540) according to the second embodiment described above, as shown in FIG. 20. As the logic simulator 590, a known simulator is used.

Upon reception of the area specifying data 905 specifying a grouping area excluding signals to be observed by the user, the logic circuit conversion device 602 converts the logic circuit description 900 as a simulation target into a logic circuit description having undergone optimal grouping and requiring a small signal processing amount on the basis of the area specifying data 905. Upon reception of the converted logic circuit description, the logic simulator 590 executes logic simulation. High-speed logic simulation can therefore be realized while the signals to be observed by the user are left as they are.

When the logic circuit conversion device 602 for performing optimal grouping for a logic circuit description in accordance with the area specified by the user is connected to the input of the logic simulator 590, a logic simulation device which executes logic simulation at high speed without degrading the debug function can be realized.

(Third Embodiment)

A logic circuit conversion device according to the third embodiment comprises a connection analyzer for analyzing circuit connection data, an asynchronous element detector for detecting an asynchronous element in a logic circuit, a grouping area determination section for determining a grouping area (to which grouping is applied) excluding the asynchronous element, a highlight display device for highlighting (emphasizing) the grouping area to visually discriminate it, and a grouping section for executing grouping for the determined area.

According to this embodiment, a grouping area excluding the asynchronous element obtained by the asynchronous element detector is determined, and the determined grouping area or the area detected as the asynchronous element is highlighted to present the circuit portion corresponding to the asynchronous element to the user (in this case, the designer of the logic circuit is assumed). This allows the user to change the design of the circuit to have fewer asynchronous elements. A circuit having undergone optimal grouping can therefore be obtained from an input asynchronous circuit description, and a circuit with fewer asynchronous elements can be easily obtained.

This embodiment will be described in more detail below.

Figure 21:
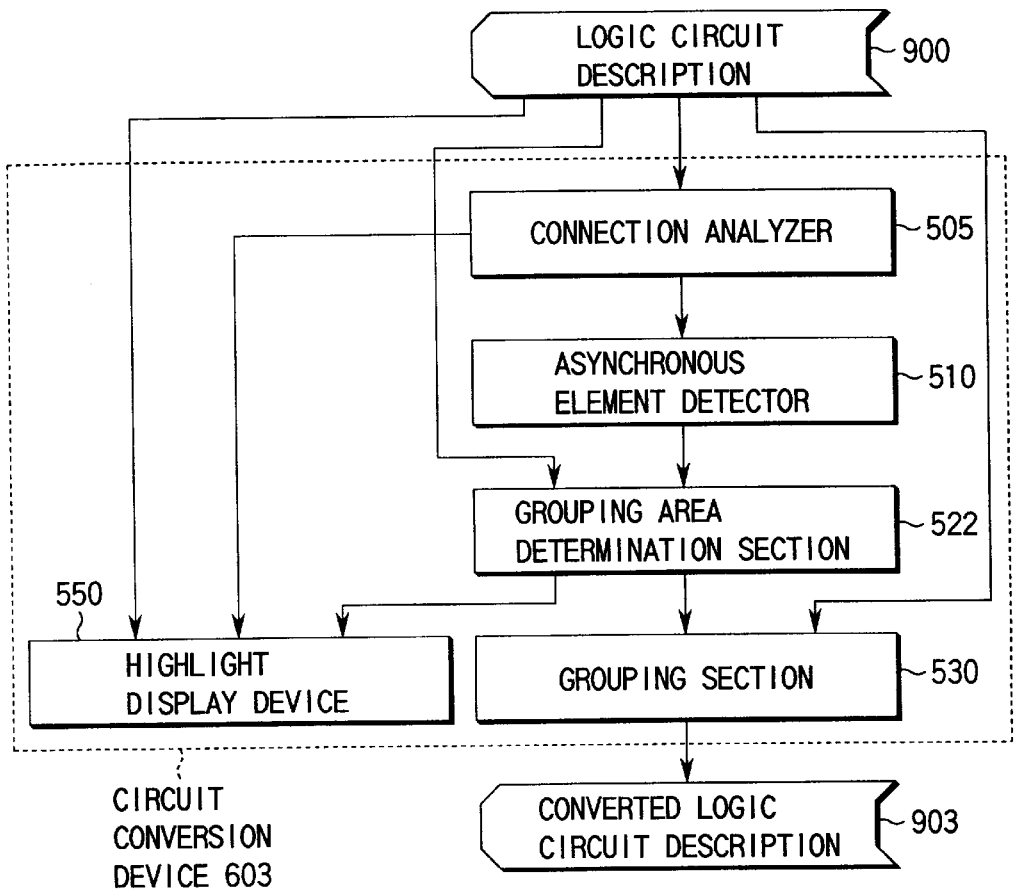
FIG. 21 is a block diagram showing the arrangement of a logic circuit conversion device according to the third embodiment of the present invention.

FIG. 21 shows the arrangement of a logic circuit conversion device 603 according to this embodiment.

The logic circuit conversion device 603 comprises the connection analyzer 505, the asynchronous element detector 510, a grouping area determination section 522, the grouping section 530, and a highlight display device 550. The connection analyzer 505, asynchronous element detector 510 and the grouping section 530 are the same as those in the first embodiment.

The connection analyzer 505 analyzes the activation relationship between event execution units (processing units based on the event-driven method), i.e., the connection relationship between the event execution units and signals (the dependence relationship between the logic processing units through the signals), as the circuit connection data in an input logic circuit description 900.

The asynchronous element detector 510 detects an asynchronous element in the event execution units (the processing units based on the event-driven method) in the input logic circuit description 900.

The grouping area determination section 522 determines specific event execution units in the logic circuit description 900 and a specific grouping sequence by which optimal grouping can be realized in an area from which the event execution unit detected as the asynchronous element in the input logic circuit description by the asynchronous element detector 510 is excluded, thereby determining an area including the event execution units to be grouped. The grouping area determination section 522 sends the data representing the determined area to the highlight display device 550.

Note that the data representing the asynchronous element detected by the asynchronous element detector 510 may be sent to the highlight display device 550 instead of or together with the data representing the determined grouping area.

The highlight display device 550 highlights the respective description areas determined by the grouping area determination section 522. Highlighting may be performed on the circuit diagram displayed on a predetermined display device or on a VHDL source code displayed on the predetermined display device. Alternatively, a graph having the respective event execution units expressed as nodes and signals propagating between the respective event execution units expressed as edges may be displayed on the predetermined display device, and highlighting may be performed on the graph.

Highlighting can be performed by performing coloring, shading, conversion of the thickness and shape of contours, flickering display, marking, or the like for the event execution units corresponding to the grouping area. In contrast to this, the above operation may be performed for event execution units outside the grouping area.

The grouping section 530 executes grouping by grouping the event execution units in each description area determined by the grouping area determination section 522.

The logic circuit conversion method used by the logic circuit conversion device 603 according to this embodiment will be described with reference to a simple example.

Figure 22:
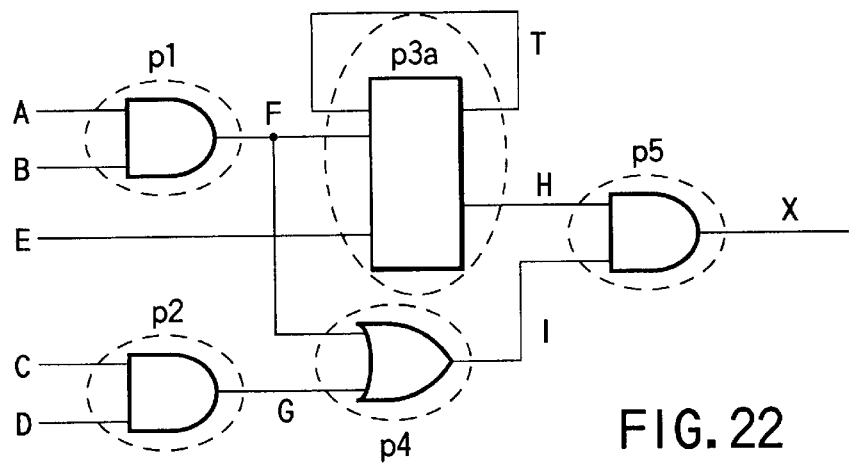
FIG. 22 is a circuit diagram showing a logic circuit description input to the third embodiment.
Figures 23, 24:
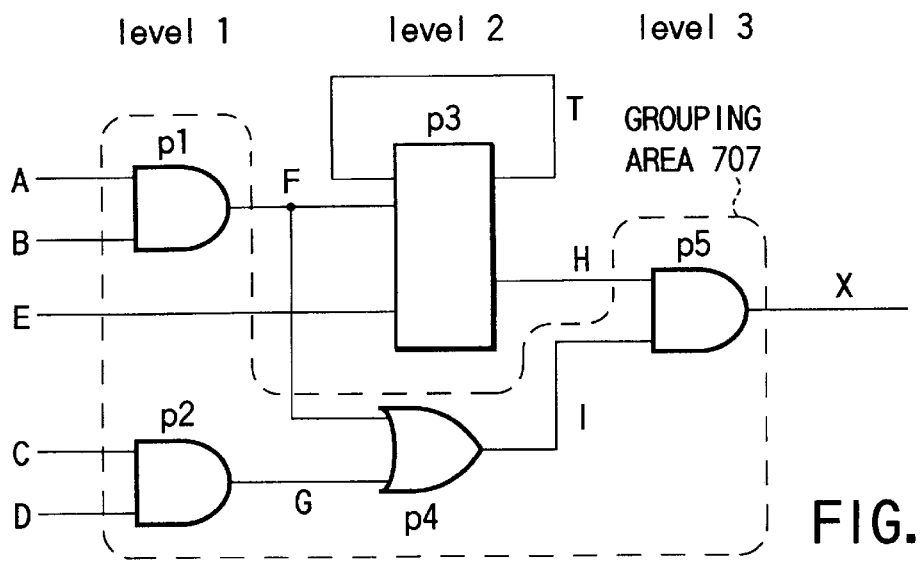
FIG. 23 is a view showing a VHDL description of logic corresponding to the circuit diagram in FIG. 22.
FIG. 24 is a circuit diagram showing a grouping area determination result in the third embodiment.

FIGS. 22 and 23 are a circuit diagram based on the input logic circuit description and a corresponding VHDL description. Referring to FIG. 22, the latch circuit p3 in FIG. 2 is replaced with an asynchronous element p3a including a self-loop like the one shown in FIG. 14. Similarly, referring to FIG. 23, the latch circuit p3 in FIG. 3 is replaced with a description of an asynchronous element p3a like the one shown in FIG. 13. In this case, the input circuit description may be expressed by a netlist.

When the description in FIG. 22 or 23 is input to the logic circuit conversion device 603, the asynchronous element detector 510 detects the event execution unit p3a as an asynchronous element.

On the basis of the detected asynchronous element, the grouping area determination section 522 determines a grouping area in which grouping can be realized by grouping event execution units. For example, this area can be determined in Step 1-1 to Step 1-5 in the first embodiment.

FIG. 24 shows an example of the result obtained by applying the above sequence to the logic circuit shown in FIG. 22. As shown in FIG. 24, the grouping area is expressed as {p1, p2, p4, p5} (the area enclosed with a broken line 707 in FIG. 24).

Figure 25:
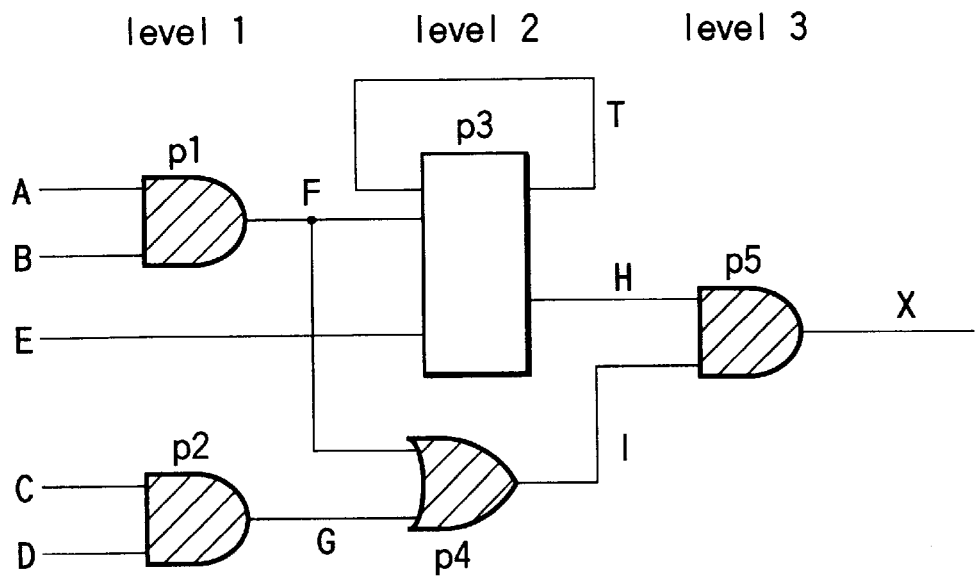
FIG. 25 shows an example of a highlight display of a grouping areas in the third embodiment.

FIG. 25 shows an example of how the event execution units in the grouping area in FIG. 24 are highlighted. In this case, the circuit elements as the event execution units are highlighted by hatching (shading).

Note that the asynchronous element may be highlighted instead of the event execution units in the grouping area on the basis of the data representing the asynchronous element and sent from the asynchronous element detector 510. FIG.

26 shows an example of how the circuit portion detected as the asynchronous element (the event execution unit p3a) in FIG. 24 is highlighted. As shown in FIG. 27, portions corresponding to the grouping area on the source code in FIG. 23 may be highlighted.

Figure 26:
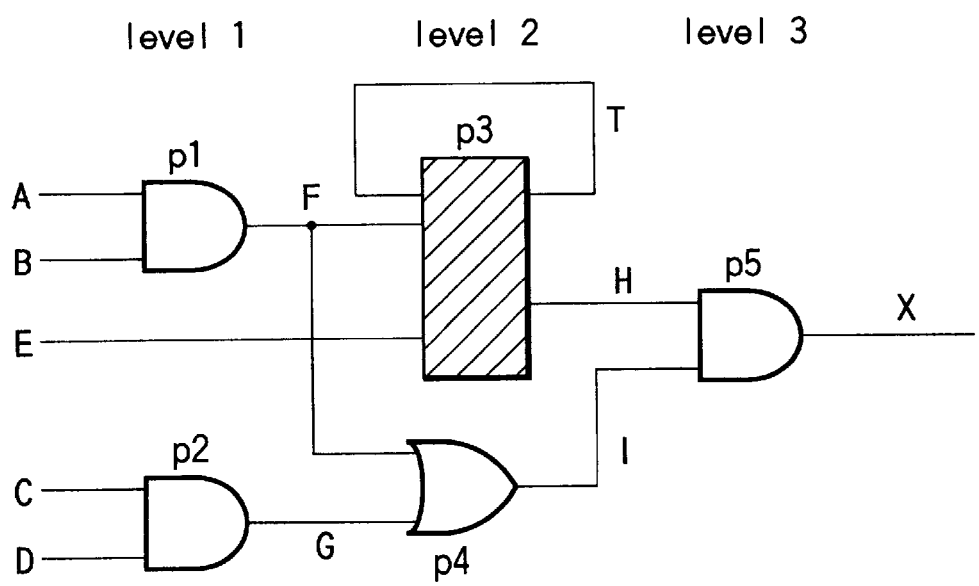
FIG. 26 shows another example of a highlight display of a grouping area in the third embodiment.

The user can know that the event execution unit p3a is the asynchronous element by seeing any one of the highlighted displays in FIGS. 25 to 27 on a predetermined display device.

Figure 29:
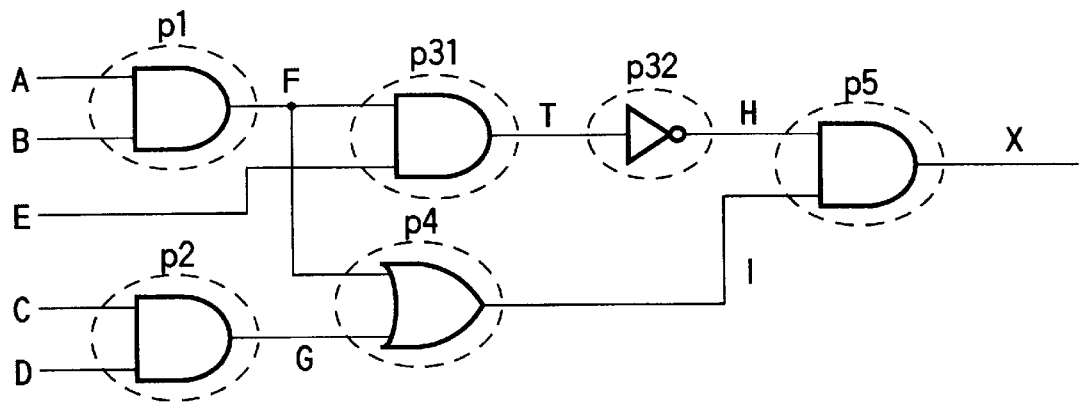
FIG. 29 is a circuit diagram corresponding to the VHDL description in FIG. 28.

Assume that the user reviewed the VHDL description in FIG. 23, judged that the event execution unit p3a could be rewritten, and rewrote the event execution unit p3a in the input VHDL description into equivalent event execution units p31 and p32, as shown in FIG. 28. FIG. 29 shows a circuit diagram corresponding to the input VHDL description in FIG. 28.

Figure 30:
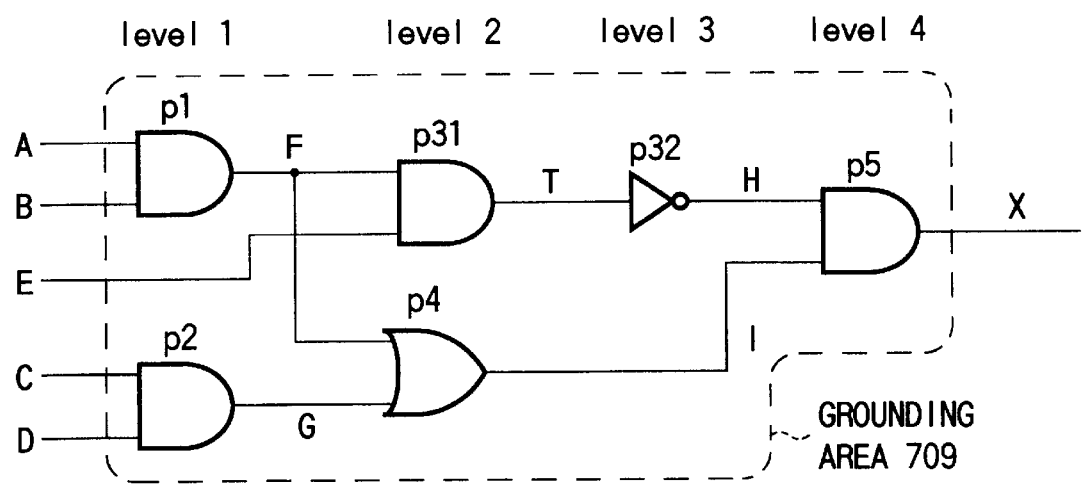
FIG. 30 is a circuit diagram showing a grouping area determination result in the third embodiment.

When the input circuit description in FIG. 28 or 29, which has been rewritten in the above manner, is input to the logic circuit conversion device 603, the asynchronous element detector 510 detects no asynchronous element in the input circuit description. The grouping area determination section 522 therefore determines {p1, p2, p31, p4, p32, p5} as a grouping area (enclosed with a broken line 709 in FIG. 30), as shown in FIG. 30, in accordance with, for example, Step 1-1 to Step 1-5 in the first embodiment.

The grouping section 530 sets as one event execution unit the group of event execution units in the area determined by the grouping area determination section 522. This operation can be realized by Step 1-A and Step 1-B in the first embodiment.

FIGS. 31 and 32 show an example of the circuit conversion result obtained by applying the above sequence to the logic circuit in FIG. 22.

FIG. 31 is a block diagram showing the conversion result. In Step 1-A, the group {p1, p2, p31, p4, p32, p5} is obtained. In Step 1-B, this group is set as one event execution unit p_m3 which receives signals A, B, E, C, and D and outputs a signal X.

FIG. 32 shows a VHDL description corresponding to the conversion result in FIG. 31. In Step 1-A, processes p1, p2, p31, p4, p32, and p5 are set as one process p_m3. As in the case shown in FIG. 31, the signals A, B, E, C, and D are inputs, and the signal X is an output. In this case, the signal F used for the propagation of a value from p1 to p31, the signal G used for the propagation of a value from p2 to p4, the signal T used for the propagation of a value from p31 to p32, the signal I used for the propagation of a value from p4 to p5, and the signal H used for the propagation of a value from p32 to p5 are respectively replaced with variables. The above replacement of signals with variables realizes optimal grouping.

The description having undergone grouping executed by the grouping section 530 is output as a converted logic circuit description 903.

Note that the output circuit description can be expressed by a diagram, a netlist, or an HDL. The HDL used is not limited to VHDL.

The above highlight display calls user's attention to the presence of asynchronous elements to allow the user to replace the circuit including the asynchronous elements with an equivalent circuit having fewer asynchronous elements. A circuit which reduces the processing amount required for the execution of simulation can be efficiently obtained from the input circuit description obtained in this manner by using the method of the first embodiment.

As in the first embodiment, a plurality of groups can be formed as grouping areas. In this case, to discriminate the respective groups by highlighting them, the respective groups may be colored in different colors or shaded in different densities.

A logic simulation device serving as a logic circuit design support device having the logic circuit conversion device according to the third embodiment will be described next.

The logic simulation device according to this embodiment comprises a logic simulator 590 for executing logic simulation on the basis of an input logic circuit description, in addition to the logic circuit conversion device 603 (constituted by the connection analyzer 505, the asynchronous element detector 510, the grouping area determination section 523, the grouping section 530, and the highlight display device 550) according to the third embodiment described above, as shown in FIG. 33. As the logic simulator 590, a known simulator is used.

The logic circuit conversion device 603 converts the logic circuit description 900 as a logic simulation target into a logic circuit description having undergone grouping and requiring a small signal processing amount. The logic simulator 590 then executes logic simulation on the basis of the converted logic circuit description as an input. This simulation device therefore has the function of allowing the user to specify an asynchronous element, and can execute logic simulation at high speed.

When the logic circuit conversion device 603 for performing optimal grouping for a logic circuit description on the basis of the area specified by the user is connected to the input of the logic simulator 590, a logic simulation device which allows the user to specify an asynchronous element before the execution of grouping, and can execute logic simulation at high speed can be realized.

(Fourth Embodiment)

A logic circuit conversion device according to this embodiment comprises a connection analyzer for analyzing circuit connection data, an asynchronous element detector for detecting an asynchronous element in a logic circuit on the basis of the circuit connection data, a circuit function detector for detecting the function of a circuit, a grouping area determination section for determining a grouping area, and a grouping section for executing grouping for the determined area.

According to this embodiment, the grouping area determination section determines a grouping area excluding the asynchronous element detected by the asynchronous element detector on the basis of the circuit connection data analyzed by the connection analyzer, the asynchronous element detected by the asynchronous element detector, and the function data of each circuit constituent element which is detected by the circuit function detector. The grouping section can execute grouping for the determined area. As a result, a circuit having undergone optimal grouping can be obtained from the input circuit description.

According to this embodiment, an input circuit description is divided into portions based on functions, e.g., a register and a combination circuit, thereby allowing the application of grouping to the portion. Therefore, high-speed logic simulation can be performed, while the output value from the register, which the designer observes with a high frequency, is left as a signal value.

This embodiment will be described in more detail below.

Figure 34:
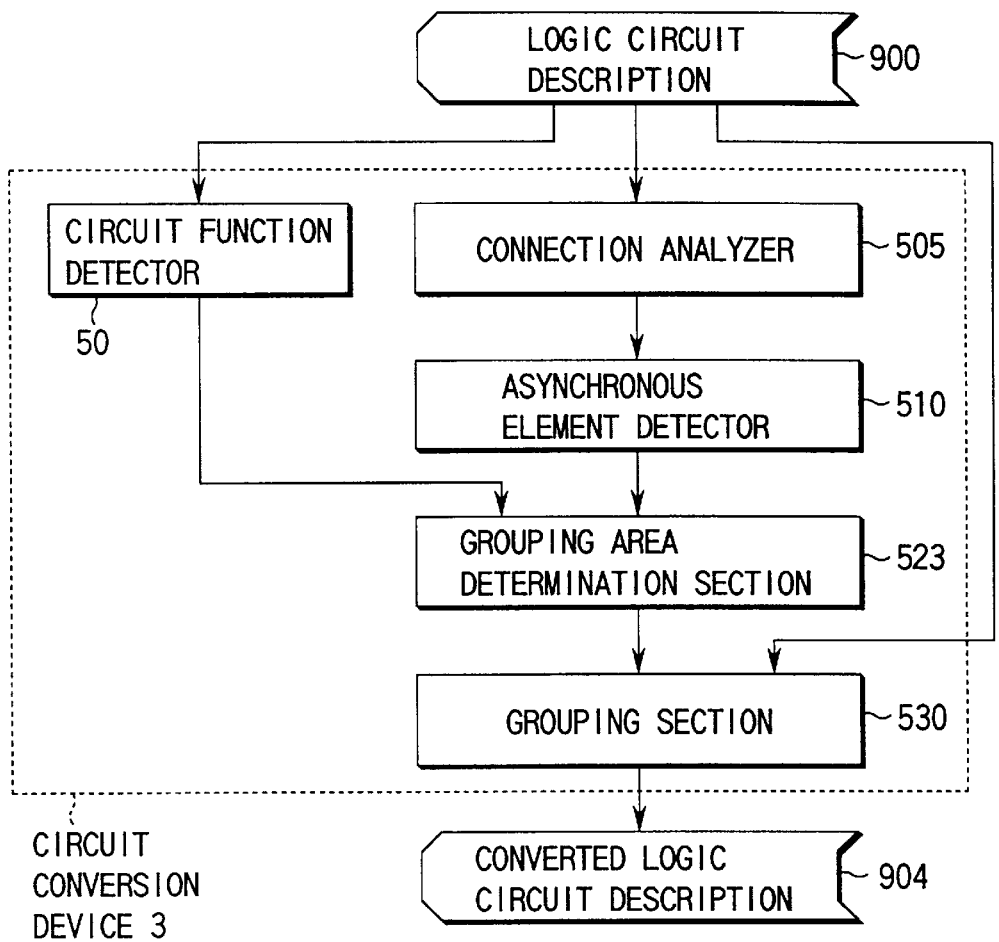
FIG. 34 is a block diagram showing the arrangement of a logic circuit conversion device according to the fourth embodiment of the present invention.

FIG. 34 shows the arrangement of the logic circuit conversion device according to this embodiment.

A logic circuit conversion device 3 according to this embodiment comprises the connection analyzer 505, the asynchronous element detector 510, a grouping area determination section 523, the grouping section 530, and a circuit function detector 50. The connection analyzer 505, asynchronous element detector 510 and the grouping section 530 are the same as those in the first embodiment.

The connection analyzer 505 analyzes the activation relationship between event execution units (processing units based on the event-driven method), i.e., the connection relationship between the event execution units and signals, as the circuit connection data in the input logic circuit description 900.

The asynchronous element detector 510 detects an asynchronous element in the event execution units (the processing units based on the event-driven method) in the input logic circuit description 900.

The circuit function detector 50 determines whether each constituent element (event execution unit) of the circuit is a clock generating circuit, a register, a latch, or a combination circuit, and outputs or holds the detection result as the function data of each circuit constituent element.

The grouping area determination section 523 determines specific event execution units in the logic circuit description 900 and a specific grouping sequence by which optimal grouping can be realized, on the basis of the circuit connection data analyzed by the connection analyzer 505 and the function data of each circuit constituent element which is detected by the circuit function detector 50, thereby determining a grouping area.

The grouping section 530 applies event execution unit grouping operation to each grouping area determined by the grouping area determination section 523, thereby performing grouping.

The logic circuit conversion method used by the logic circuit conversion device 3 according to this embodiment will be described with reference to a simple example.

Figure 35:
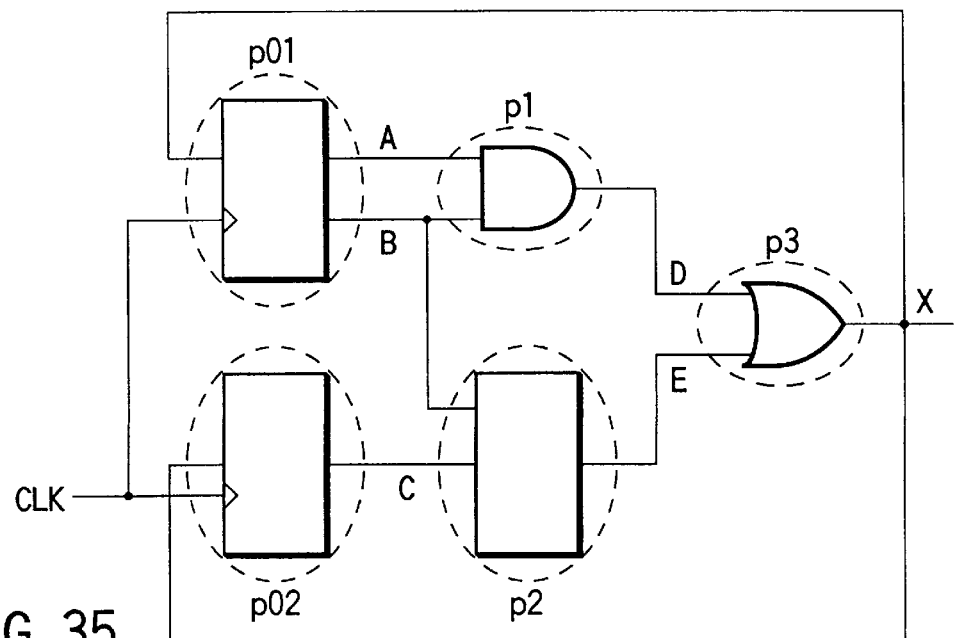
FIG. 35 is a circuit diagram showing an input logic circuit description input to the fourth embodiment.

FIG. 35 is a circuit diagram based on the input logic circuit description. The circuit in FIG. 35 is constituted by a register p01 for propagating a signal X and the inverted signal X on signals A and B at the leading edge of a clock, a register p02 for propagating the signal X on a signal C at the leading edge of a clock, a latch p2 for latching the signal C, an AND circuit p1 for outputting the AND of the signals A and B as a signal D, and an OR circuit p3 for outputting the OR of the signal D and a signal E as the signal X. For the sake of simplicity, assume that the clock is externally input.

Figures 36, 37:
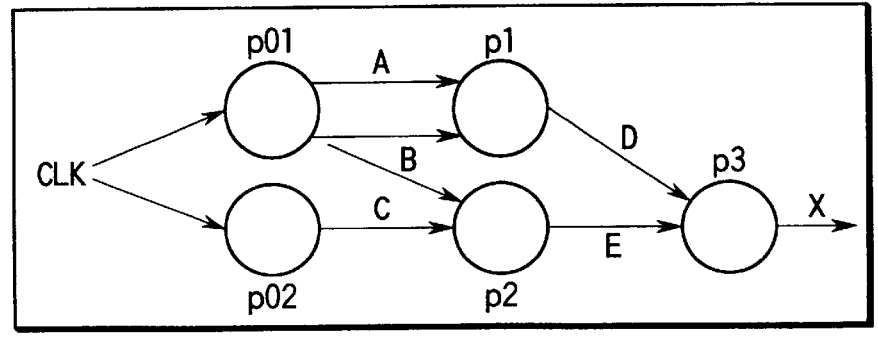
FIG. 36 is a view showing a VHDL description of logic corresponding to the circuit diagram in FIG. 35.
FIG. 37 is a view showing connection relationship data between event execution units and signals in the fourth embodiment.

FIG. 36 shows a VHDL description corresponding to the circuit diagram of FIG. 35. Referring to FIGS. 35 and 36, reference symbols p01, p02, p1, p2, and p3 denote event execution units. FIG. 35 corresponds the circuit elements. FIG. 36 corresponds to the VHDL processes. Note that the input logic circuit description may be expressed by a netlist.

When the description in FIG. 35 or 36 is input to the logic circuit conversion device 3, the grouping area determination section 523 generates connection relationship data between the event execution units and the signals as shown in FIG. 37. For the sake of simplicity, the connection relationship is expressed in graph, as in the first embodiment. However, the data may be held in the form of a structure.

The circuit function detector 50 outputs the function data of the event execution units p01, p02, p1, p2, and p3, as shown in FIG. 38. The function data and the event execution units may be described in IDs.

On the basis of the function data in FIG. 38, the grouping area determination section 523 determines a grouping area in which grouping can be realized by grouping event execution units. For example, determination of such an area for a synchronous circuit constituted by registers and a combination circuit can be realized by the following sequence.

(Step 4-1) Levels are assigned to the respective event execution units in the ascending order of longest paths from the input side by using a circuit connection graph.

(Step 4-2') Assume that GR1 and GR2 represent null groups.

(Step 4-3b) The functions of the event execution units are judged by scanning them in the ascending order of levels, starting from the input side. Event execution units having a register function are sequentially included in the group GR1. Event execution units having a combination circuit function are sequentially included in the group GR2.

(Step 4-4') If no event execution unit is left as a candidate for grouping, the sequence is ended. The event execution units included in the groups GR1 and GR2 define grouping areas.

FIG. 39 shows the result obtained by applying the above sequence to the description in FIG. 37. In Step 1, levels 1, 1, 2, 2, and 3 are respectively assigned to the event execution units p01, p02, p1, p2, and p3. Since the functions of the event execution units p01, p02, p1, p2, and p3 respectively correspond to a register, a register, a combination circuit, a latch, and a combination circuit, the event execution units p01 and p02 are included in the group GR1 in the order named, and the event execution units p1 and p3 are included in the group GR2 in the order named in Step 3b. Therefore, grouping areas are respectively defined by {p01, p02}, and {p1, p3}.

The grouping section 530 sets as one event execution unit the group of event execution units in each area determined by the grouping area determination section 523. This operation can be realized in Step 1-A and Step 1-B in the first embodiment.

Figures 41, 42:
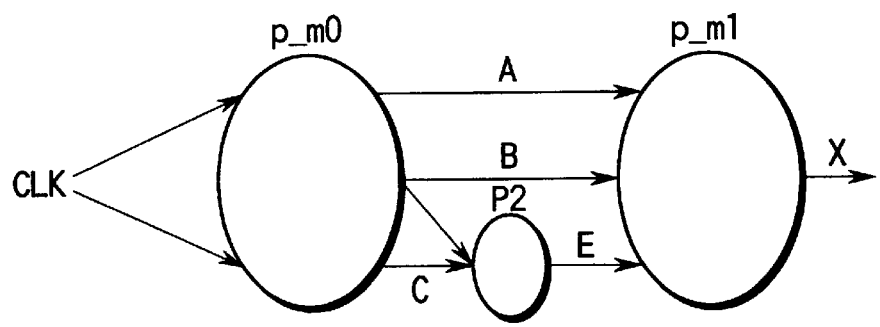
FIG. 41 is a view showing a VHDL description of a logic circuit conversion result in the fourth embodiment.
FIG. 42 is a circuit connection graph representing a logic circuit conversion result in the fourth embodiment.

FIGS. 40 to 42 show the circuit conversion result obtained by applying the grouping sequence to the description in FIG. 39.

FIG. 40 is a block diagram showing the conversion result. In Step 1-A, the event execution units p01 and p02 are grouped into one event execution unit p_m0 which receives signals CLK and X and outputs signals A, B, and C. The event execution units p1 and p3 are also grouped into one event execution unit p_m1 which receives the signals A and B and a signal E and outputs the signal X.

FIG. 41 shows a VHDL description corresponding to the conversion result. A signal D used for the propagation of a value between p1 and p3 is replaced with a variable to realize optimal grouping.

FIG. 42 shows a circuit connection graph corresponding to FIGS. 40 and 41.

The description having undergone grouping performed by the grouping section 530 is output as a logic circuit description 903.

Note that the output circuit description can be expressed by a diagram, a netlist, or an HDL. The HDL used is not limited to VHDL.

In this logic circuit conversion device having the circuit function detector, grouping can be sequentially applied to registers and combination circuits. Therefore, high-speed logic simulation can be performed, while the output value from a register, which the designer observes with a high frequency, is left as a signal value.

A logic simulation device serving as a logic circuit design support device having the logic circuit conversion device according to the fourth embodiment will be described next.

The logic simulation device according to this embodiment comprises a logic simulator 590 for executing logic simulation on the basis of the input logic circuit description 900, in addition to the logic circuit conversion device 3

Figure 43:
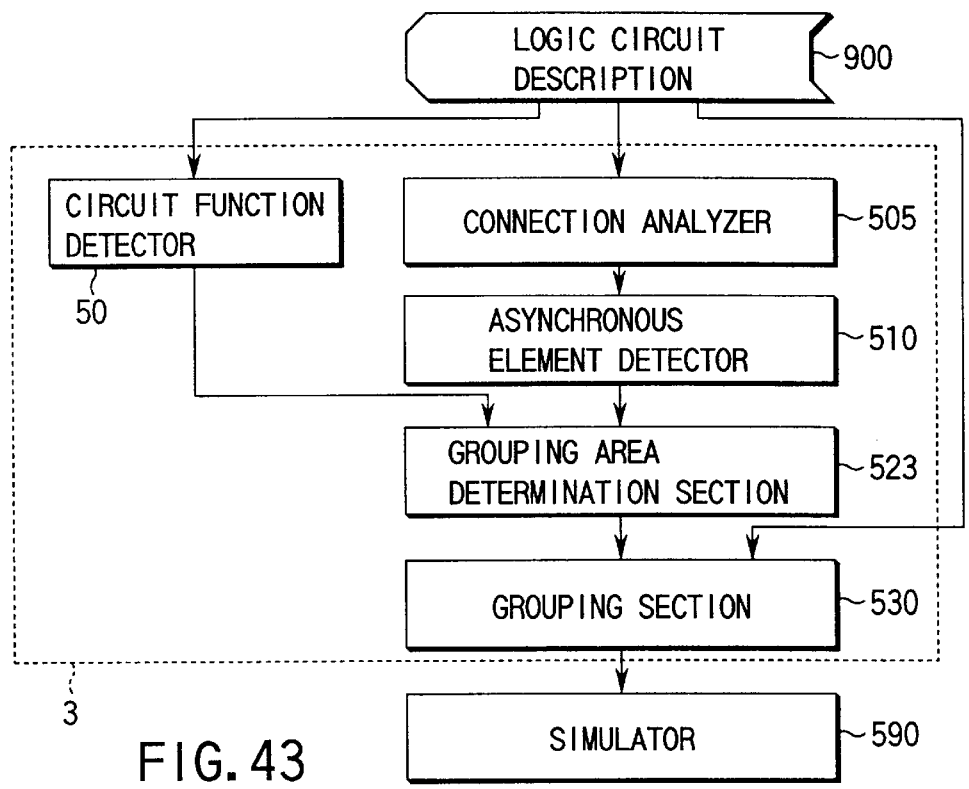
FIG. 43 is a block diagram showing the arrangement of a logic simulation device using the fourth embodiment.

(constituted by the connection analyzer 505, the asynchronous element detector 510, the grouping area determination section 523, the grouping section 530, and the circuit function detector 50) according to the fourth embodiment described above, as shown in FIG. 43. As the logic simulator 590, a known simulator is used.

The logic circuit conversion device 3 groups the event execution units of the logic circuit description 900 as a logic simulation target into groups by classifying them based on the circuit functions (registers and combination circuits in this case), and converts the description into a logic circuit description having undergone grouping in units of groups and requiring a small signal processing amount. The logic simulator 590 then receives the converted logic circuit description and executes logic simulation. According to this embodiment, therefore, high-speed logic simulation can be performed, while the output value from a register, which the designer observes with a high frequency, is left as a signal value.

When the logic circuit conversion device 3 for performing optimal grouping for a logic circuit description is connected to the input of the logic simulator 590, a logic simulation device which executes logic simulation at high speed without degrading the debug function can be realized.

(Fifth Embodiment)

A logic circuit conversion device according to this embodiment comprises a connection analyzer for analyzing circuit connection data, an asynchronous element detector for detecting an asynchronous element in a logic circuit on the basis of the circuit connection data, an analyzer for analyzing a signal processing flow in an input logic circuit excluding the asynchronous element, a determination section for determining a portion of the input logic circuit based on the signal processing flow in which event judgment logic is inserted, and an inserting section for inserting the event judgment logic in the event logic insert portion of the input logic circuit which is determined by the determining section.

According to this embodiment, start and end portions of signal assignment processing in an area in the input logic circuit in which the possibility that execution is unnecessary is high and from which an asynchronous element is excluded are grouped by the event judgment logic, thereby converting the input logic circuit into a logic circuit capable of executing simulation at a higher speed.

According to conventional logic simulation, since the signal processing flow in an input logic circuit description cannot be changed, efficient simulation is difficult to execute. According to this embodiment, an input logic circuit is converted into a logic circuit capable of executing simulation at a higher speed, and the converted description is input to a logic simulator, thereby realizing high-speed logic simulation.

This embodiment will be described in more detail below.

Figure 44:
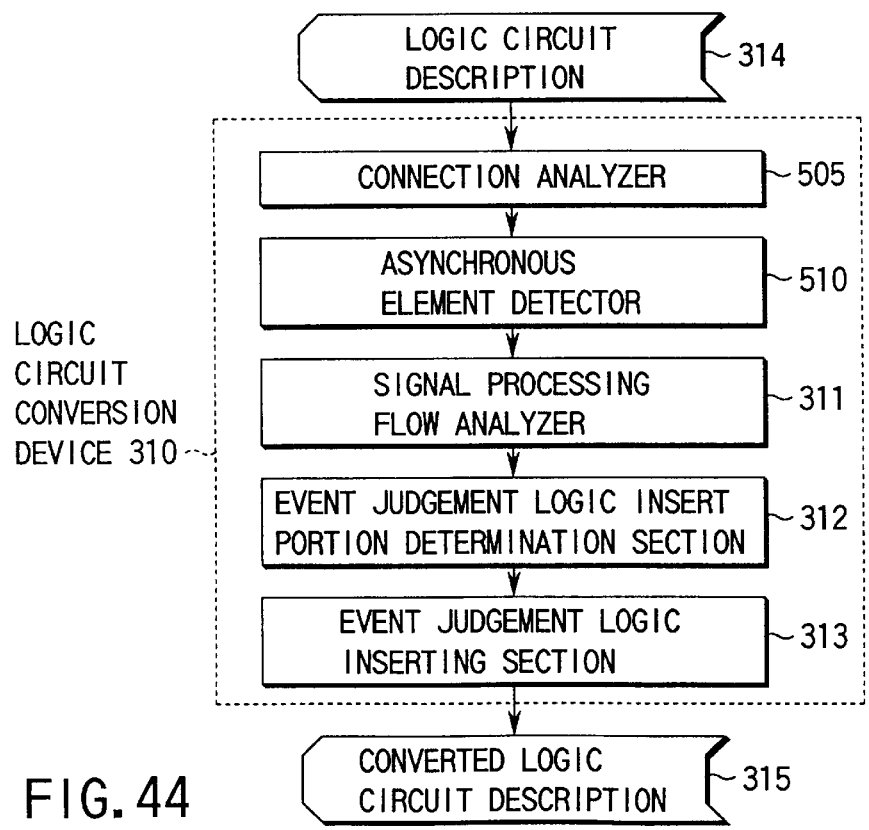
FIG. 44 is a block diagram showing the arrangement of a logic circuit conversion device according to the fifth embodiment of the present invention.

FIG. 44 shows the arrangement of a logic circuit conversion device 310 according to this embodiment.

The logic circuit conversion device 310 comprises the connection analyzer 505 for analyzing circuit connection data, the asynchronous element detector 510 for detecting an asynchronous element in a logic circuit on the basis of the circuit connection data, a signal processing flow analyzer 311 for analyzing a signal processing flow in an input logic circuit excluding the asynchronous element, an event judgment logic insert portion determination section 312 for determining a portion of the input logic circuit based on the signal processing flow in which event judgment logic is inserted, and an event judgment logic inserting section 313 for inserting the event judgment logic in the event logic insert portion of the input logic circuit which is determined by the determining section.

The event judgment logic is a condition judgment sentence inserted at start and end of a given logic processing unit such that the given logic processing unit is evaluated upon an occurrence of a given signal event.

The connection analyzer 505 analyzes the activation relationship between event execution units (processing units based on the event-driven method), i.e., the connection relationship between the event execution units and signals, as the circuit connection data in the input logic circuit description 314.

The asynchronous element detector 510 detects an asynchronous element in the event execution units (the processing units based on the event-driven method) in the input logic circuit description 314.

The signal processing flow analyzer 311 analyzes the signal processing flow described in a logic circuit description 314 excluding the asynchronous element to obtain the dependence relationship data between signals and logic processing units. The logic processing units include units to be grouped by the event judgment logic. More specifically, these units include circuit elements such as AND and OR gates, signal assignment statements, and event execution units or a group thereof.

The event judgment logic insert portion determination section 312 determines start and end portions of a specific logic processing unit, in the logic circuit description 314, in which the event judgment logic is to be inserted, on the basis of the dependence relationship data analyzed by the signal processing flow analyzer 311 after excluding the asynchronous element detected by the asynchronous element detector 510. A plurality of logic processing units consecutively described in the circuit description may be grouped into one unit, and the event judgment logic can be inserted in the start and end portions of the unit.

The event judgment logic inserting section 313 inserts appropriate event judgment logic in the insert portions detected by the event judgment logic insert portion determination section 312 to convert the logic circuit description 314 into a logically equivalent circuit description. The equivalently converted circuit description is output as a converted logic circuit description 315.

The logic circuit conversion method used by the logic circuit conversion device 310 according to this embodiment will be described with reference to a simple example.

Figures 45, 46:
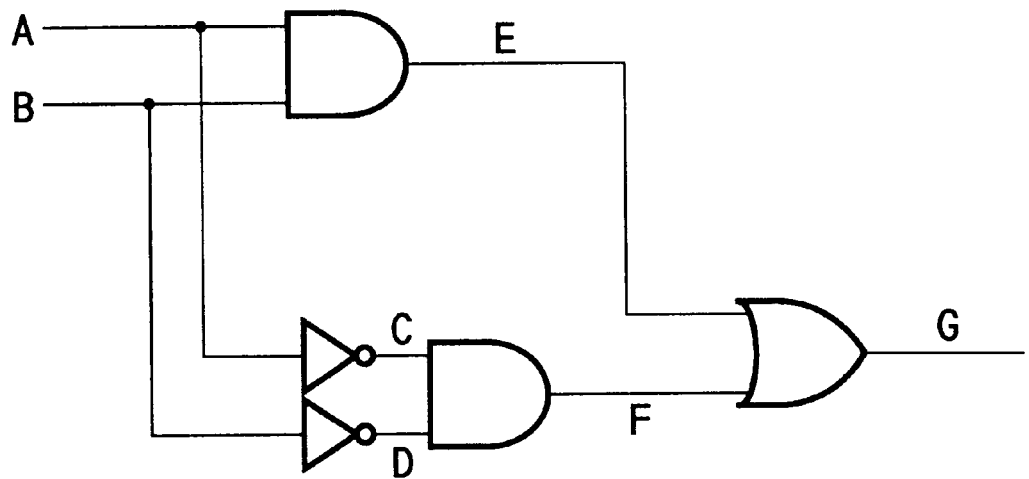
FIG. 45 is an example of a logic circuit description which is input to the fifth embodiment and excludes an asynchronous element.
FIG. 46 is a view showing an example of the logic circuit description in FIG. 45 using the C language.

FIG. 45 is a circuit diagram based on the input logic circuit description after removal of the asynchronous element. The XOR (exclusive OR) of signals A and B is output as a signal G.

Figure 47:
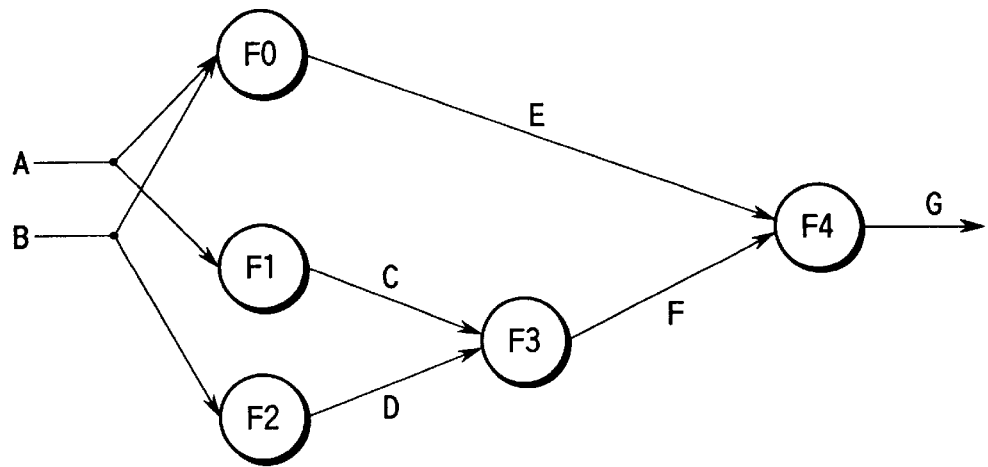
FIG. 47 is a view showing circuit connection data in the fifth embodiment.

FIG. 46 is a C language description of the logic corresponding to the circuit diagram of FIG. 45. Upon reception of the circuit description in FIG. 46, the signal processing flow analyzer 311 generates data about the connection relationship between the logic processing units and the signals. This connection relationship data is preferably expressed as graph data with nodes representing the logic processing units and edges representing the start signals, as shown in FIG. 47.

Figure 48:
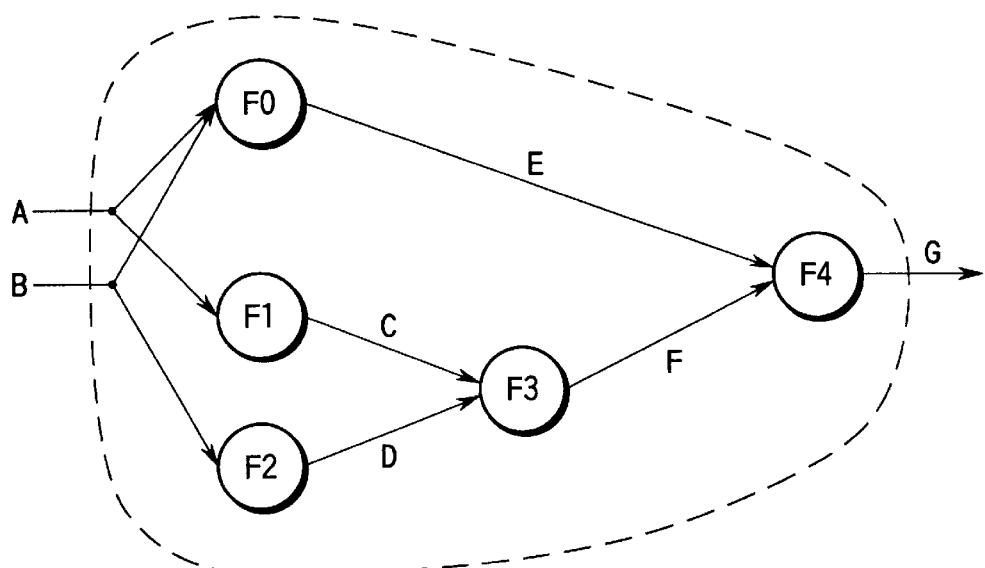
FIG. 48 is a view showing an event judgment logic insert portion determination result in the fifth embodiment.

The event judgment logic insert portion determination section 312 obtains, on this graph, a group, of the closed groups of logic processing units, in which the number of times of signal assignment processing is as many as possible in comparison with the number of input signals. In this case, this group is obtained as the node group enclosed with the broken line in FIG. 48. A method of obtaining this group will be described in detail later.

The event judgment logic inserting section 313 inserts event judgment logic in the start and end portions of the logic processing unit or the logic processing unit group obtained by the event judgment logic insert portion determination section 312. In this case, when the values of input signals A and B to the group in a previous simulation cycle are expressed as A_old and B_old, respectively, the above operation corresponds to conversion to the description in FIG. 49.

The description in which the event judgment logic is inserted by the event judgment logic inserting section 313 is output as the logic circuit description 315. Obviously, in this conversion method, the simulation result on the logic circuit description 315 coincides with the simulation result on the original logic circuit description 314.

For the sake of simplicity, the number of times of signal assignment processing in a partial description grouped by the event judgment logic is five, which is not very large as compared with the number (two) of signals to be checked by the event judgment logic. As in the case shown in FIG. 50, however, when the number of times (2+2n) of signal assignment processing included in the partial description grouped by the event judgment logic is very large as compared with the number (two) of signals to be checked by the event judgment logic, the simulation speed can be greatly increased by conversion.

To replace the logic circuit description 314 with the logic circuit description 315 allowing the execution of simulation at a higher speed, the event judgment logic insert portion determination section 312 must properly determine event judgment logic insert portions. A processing method in the event judgment logic insert portion determination section 312 will be described below. As described above, the event judgment logic insert portion determination section 312 must obtain a group, of the closed groups of logic processing units, in which the number of times of signal assignment processing is as large as possible as compared with the number of input signals, on a graph representing connection relationship data. A logic processing unit group, in the start and end portions of which the event judgment logic is to be inserted must be obtained on the condition that no path (a string of edges) should go outside the group and enter it again. The reason for this will be described below. The logic processing unit group enclosed with the broken line in FIG. 51 has a path extending from a node F1 to a node F4 through edges C and F. Since this path passes through the node F3 outside the group, the above condition is not met. The presence of a path passing through the nodes F1, F3, and F4 on the graph means that processing must be executed in the order of the nodes F1, F3, and F4. If, therefore, the nodes F1 and F4 are grouped by the event judgment logic to be processed at once, a contradiction arises against the above execution order.

The state of a logic processing unit group (node group) in which there is no path going outside the group and entering it again will be referred to as a closed state or the like hereinafter.

For example, a closed logic processing unit group in which the number of times of signal assignment processing is large as compared the number of input signals can be obtained on a graph by representing the number of times of signal assignment processing in each logic processing unit by the size of a node, and solving the problem of finding "a closed node group in which the sum of the sizes of the nodes is large as compared with the number of input edges" on the connection graph.

Figure 52:
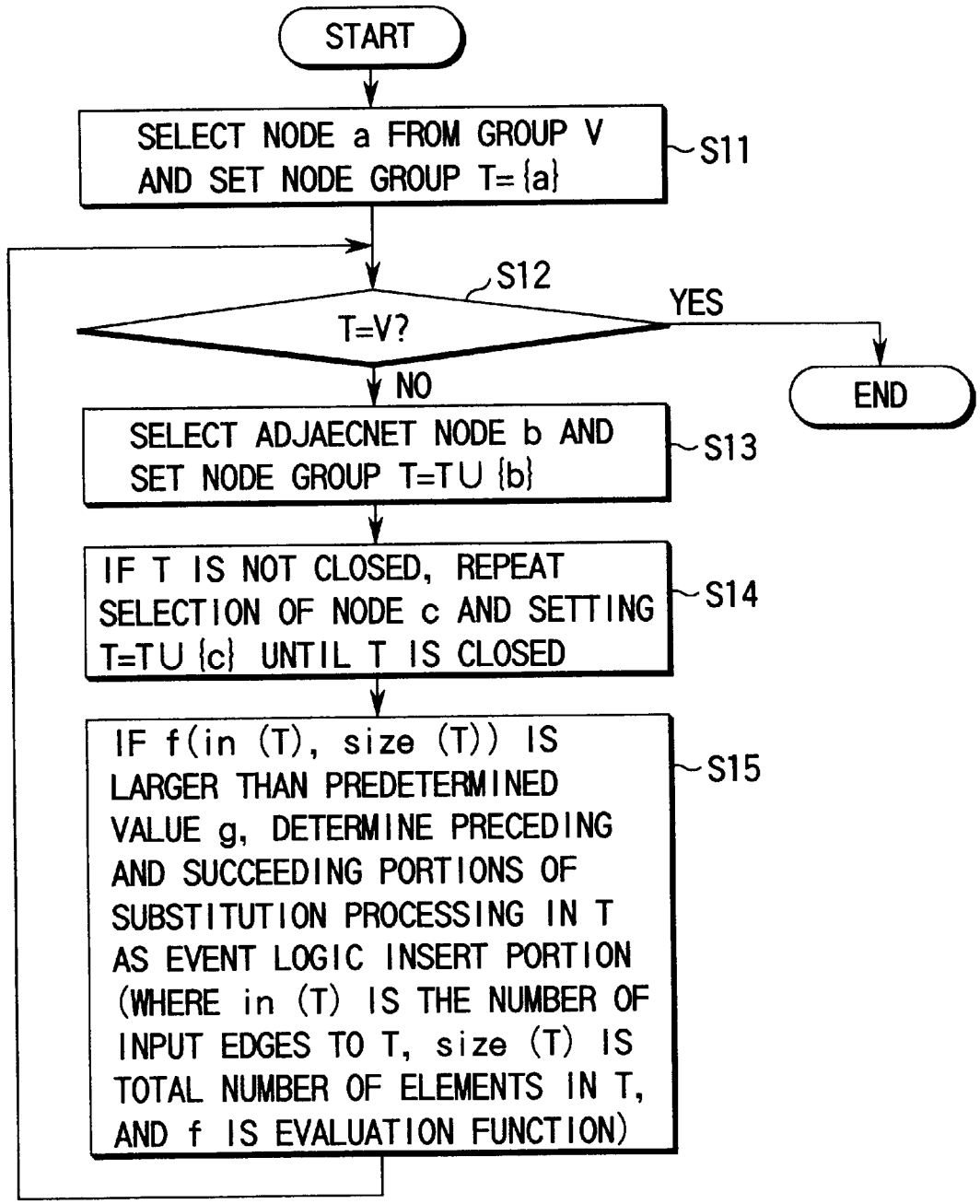
FIG. 52 is a flow chart showing an example of processing in a judgment logic insert portion determination section in the fifth embodiment.

For example, this problem can be solved by searching for a node group in accordance with the sequence shown in FIG. 52. Assume that the connection graph is represented as G=(V, E). In addition, U represents the set; V, all nodes; and E, all edges.

First of all, an appropriate node a is selected from V, and node group T={a} is set (Step S11).

If it is determined in Step S12 that T=V, the search is terminated.

If NO in Step S12, a node b adjacent to T is selected, and T=T ∪ {b} is set (Step S13).

If T is not closed, an appropriate node c is repeatedly selected, and T=T ∪ {c} is repeatedly set until T is closed (Step S13).

If f(in(T), size(T)) is larger than a predetermined value A, the start and end portions of signal assignment processing in the group T are determined as event logic insert portions. The flow then returns to Step S12. In this case, in(T) represents the number of input edges to T; size(T), the sum of sizes of the elements in T; and f, an evaluation function.

The above algorithm is designed for a non-deterministic search. If this algorithm is combined with depth-priority search processing, a search can be performed with all node partial groups being set to T.

As the size of a node, the number of description lines in each logic processing unit or the product sum obtained by adding the weighted execution times for the respective types of signal processing may be used instead of the number of times of signal assignment processing.

Figure 53:
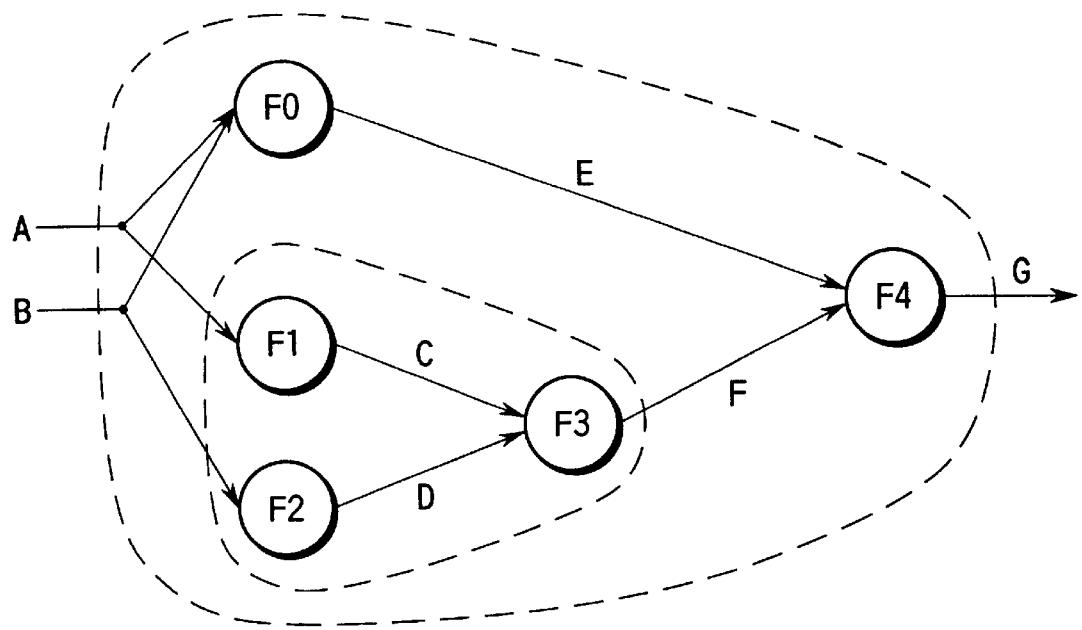
FIG. 53 is a view showing a circuit in which the event judgment logic in the fifth embodiment is inserted in a nested form.

A plurality of event judgment logic insert portions may be set. In addition, insert portions may have a nested structure, as shown in FIG. 53.

As described above, according to this embodiment, the start and end portions of signal assignment processing, in an input logic circuit description, which exhibits a high possibility that execution is unnecessary, are grouped by event judgment logic, thereby simulating the input logic circuit description at a higher speed.

According to the conventional logic simulation method, since simulation is executed without changing the signal processing flow in an input logic circuit description, it is difficult to efficiently execute simulation. According to this embodiment, a high-speed logic simulator can be realized, which execute simulation after converting an input logic circuit description into a logic circuit description which allows execution of simulation at a higher speed.

A logic simulation device serving as a logic circuit design support device having the logic circuit conversion device according to the fifth embodiment will be described next.

Figure 54:
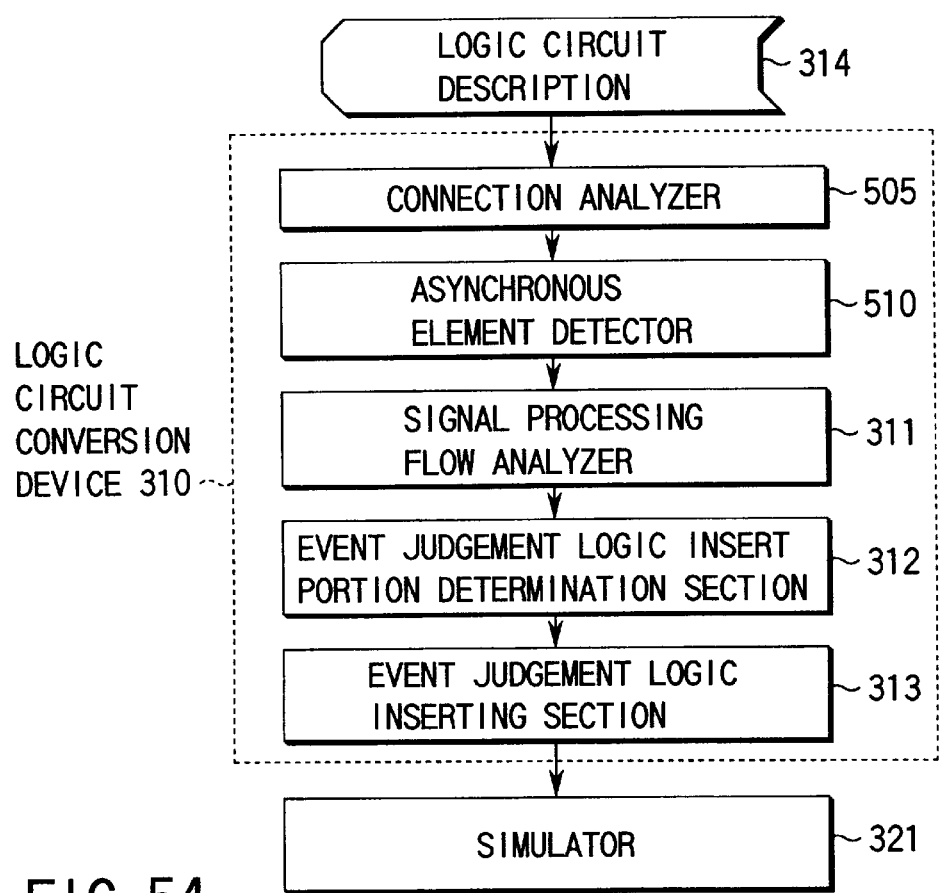
FIG. 54 is a block diagram showing the arrangement of a logic simulation device using the fifth embodiment.

The logic simulation device according to this embodiment comprises a simulator 321 for executing logic simulation on the basis of the input logic circuit description 314, in addition to the logic circuit conversion device 310 (constituted by the connection analyzer 505, the asynchronous element detector 510, the signal processing flow analyzer 311, the event judgment logic insert portion determination section 312, and the event judgment logic inserting section 313) according to the fifth embodiment, as shown in FIG. 54. As the simulator 321, a known simulator is used.

The logic circuit conversion device 310 converts the input logic circuit description 314 into a logically equivalent circuit description which allows execution of simulation at a higher speed. The simulator 321 receives the equivalently converted circuit description and executes logic simulation.

In the fifth embodiment, the logic circuit conversion device 310 equivalently converts the input logic circuit description 314, and inputs the resultant description to the simulator 321, thereby executing simulation.

If, however, the logic simulation device uses a compiler scheme instead of an interpreter scheme, simulation may be executed at a higher speed by performing logic circuit conversion at a target language level than at other levels.

In such a case, the logic circuit description 314 is preferably input to the simulator 321 after logic circuit conversion at the target language level rather than being input to the logic circuit conversion device 310.

(Sixth Embodiment)

When the designer knows, in advance, the approximate frequency of occurrence of events of each signal in a logic circuit description input to the logic circuit conversion device according to the fifth embodiment, event judgment logic insert portions can be determined more accurately by using this information.

Figure 55:
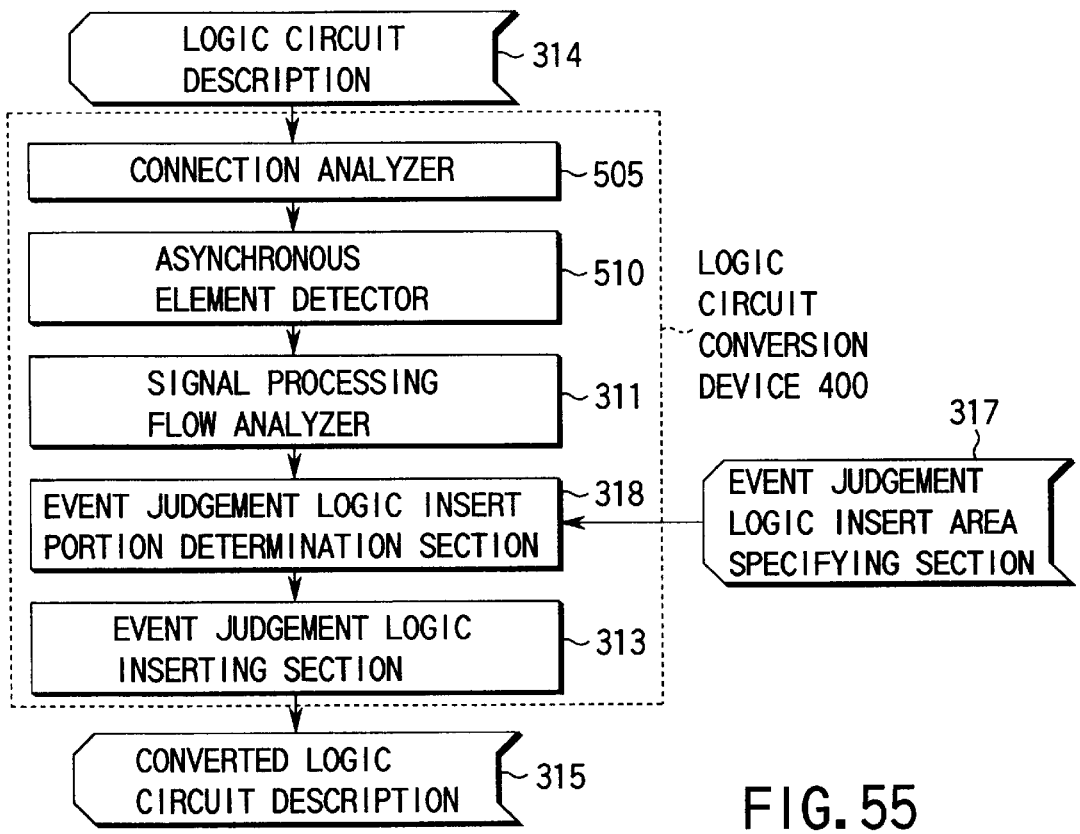
FIG. 55 is a block diagram showing the arrangement of a logic circuit conversion device according to the sixth embodiment of the present invention.

As in a logic circuit conversion device 400 shown in FIG. 55, a logic circuit conversion result that allows simulation at a higher speed can be obtained by using an event judgment logic insert area specifying section 317 having the function of allowing the designer to specify event judgment logic insert portions in advance, and an event judgment logic insert portion determination section 318 having the function of determining event judgment logic insert portions on the basis of the specified portions.

For example, a group of logic processing units may be specified by describing it like "F0, F1, F2, F3, F4". Alternatively a group may be specified as a group of input signals or a group of output signals like {A, B}; {G}.

A logic simulation device serving as a logic circuit design support device having the logic circuit conversion device according to the sixth embodiment will be described next.

Figure 56:
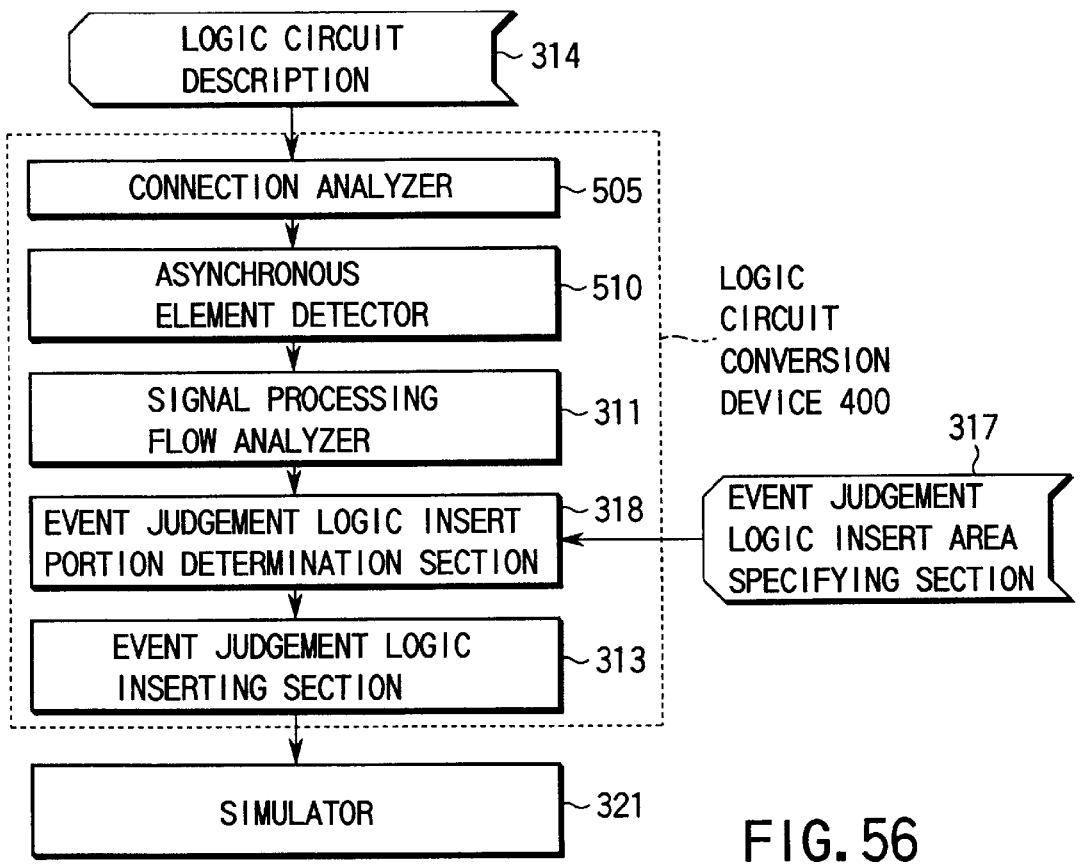
FIG. 56 is a block diagram showing the arrangement of a logic simulation device using the sixth embodiment.

The logic simulation device according to this embodiment comprises a known simulator 321, in addition to the logic circuit conversion device 400 of the sixth embodiment, as shown in FIG. 56.

(Seventh Embodiment)

Figure 57:
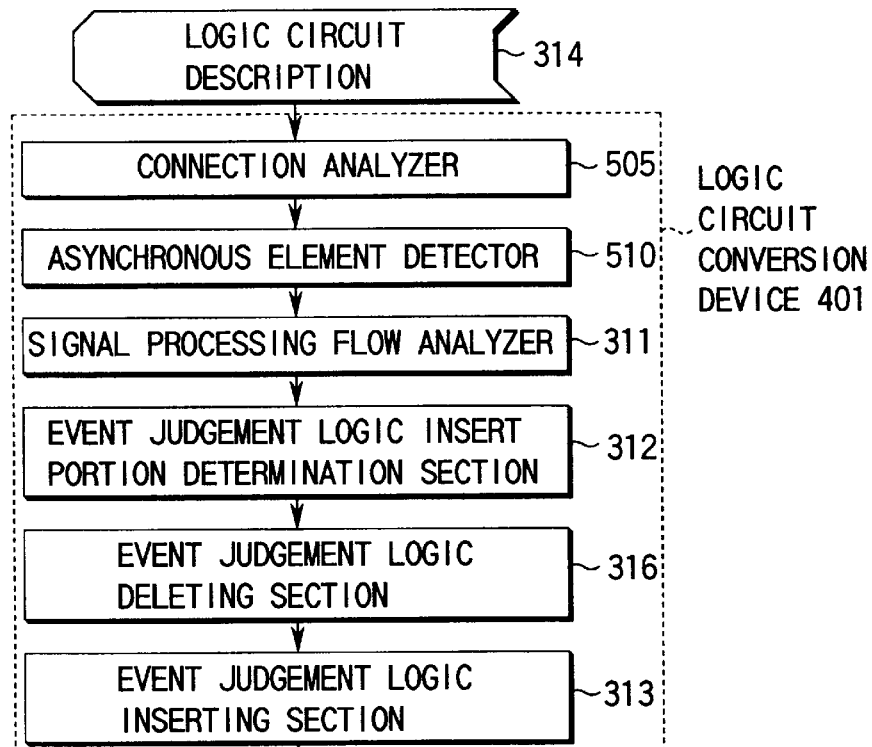
FIG. 57 is a block diagram showing the arrangement of a logic circuit conversion device according to the seventh embodiment of the present invention.

If the event occurrence frequency of each signal in a circuit greatly changes during simulation, the inserted event judgment logic is preferably deleted first, and then re-inserted in another portion. For this purpose, it suffices if the fifth embodiment additionally has an event judgment logic deleting section 316 for deleting event judgment logic, like a logic circuit conversion device 401 in FIG. 57.

In this embodiment, the event judgment logic to be described upon conversion by the logic circuit conversion device must be discriminated from the event judgment logic that has been originally described in the logic circuit description. This discrimination can be realized by inserting a comment containing an appropriate identifier in a "line", in a circuit description, in which event judgment logic is inserted or in the start or end portion of the "line".

A logic simulation device serving as a logic circuit design support device having the logic circuit conversion device according to the seventh embodiment will be described next.

Figure 58:
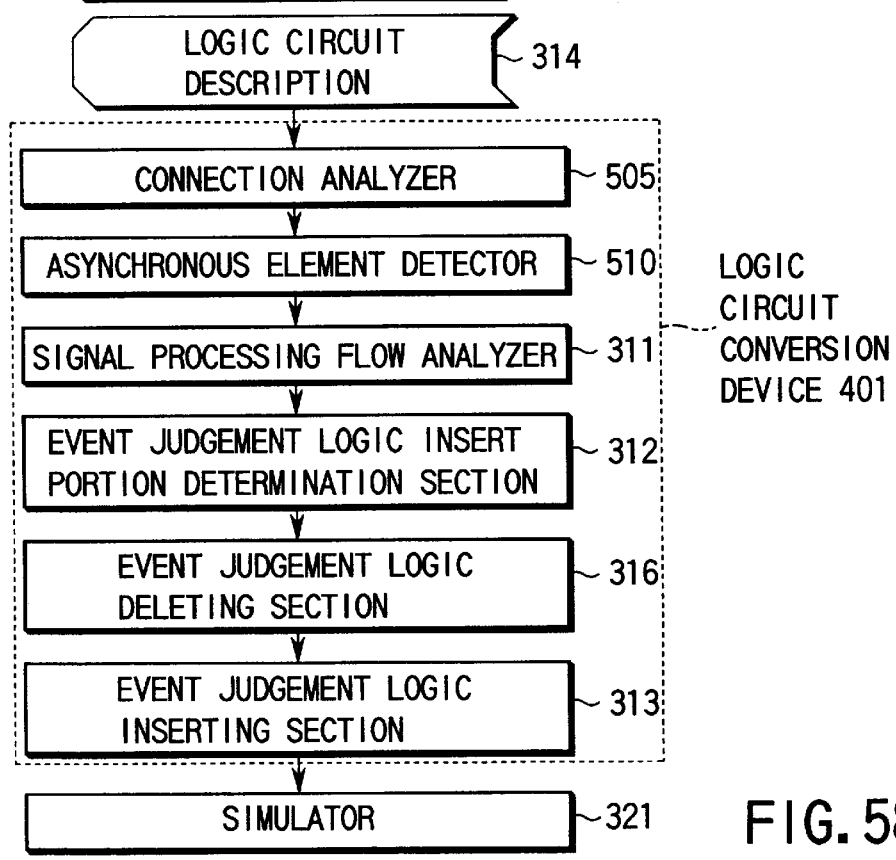
FIG. 58 is a block diagram showing the arrangement of a logic simulation device using the seventh embodiment.

The logic simulation device according to this embodiment comprises a known simulator 321, in addition to the logic circuit conversion device 401 according to the seventh embodiment, as shown in FIG. 58.

(Eighth Embodiment)

If there is execution history data that describes the approximate event occurrence frequency of each signal in the logic circuit description input to the logic circuit conversion device according to the fifth embodiment, it is expected that event judgment logic insert portions can be determined more accurately by using this data.

Figures 59, 60, 61:
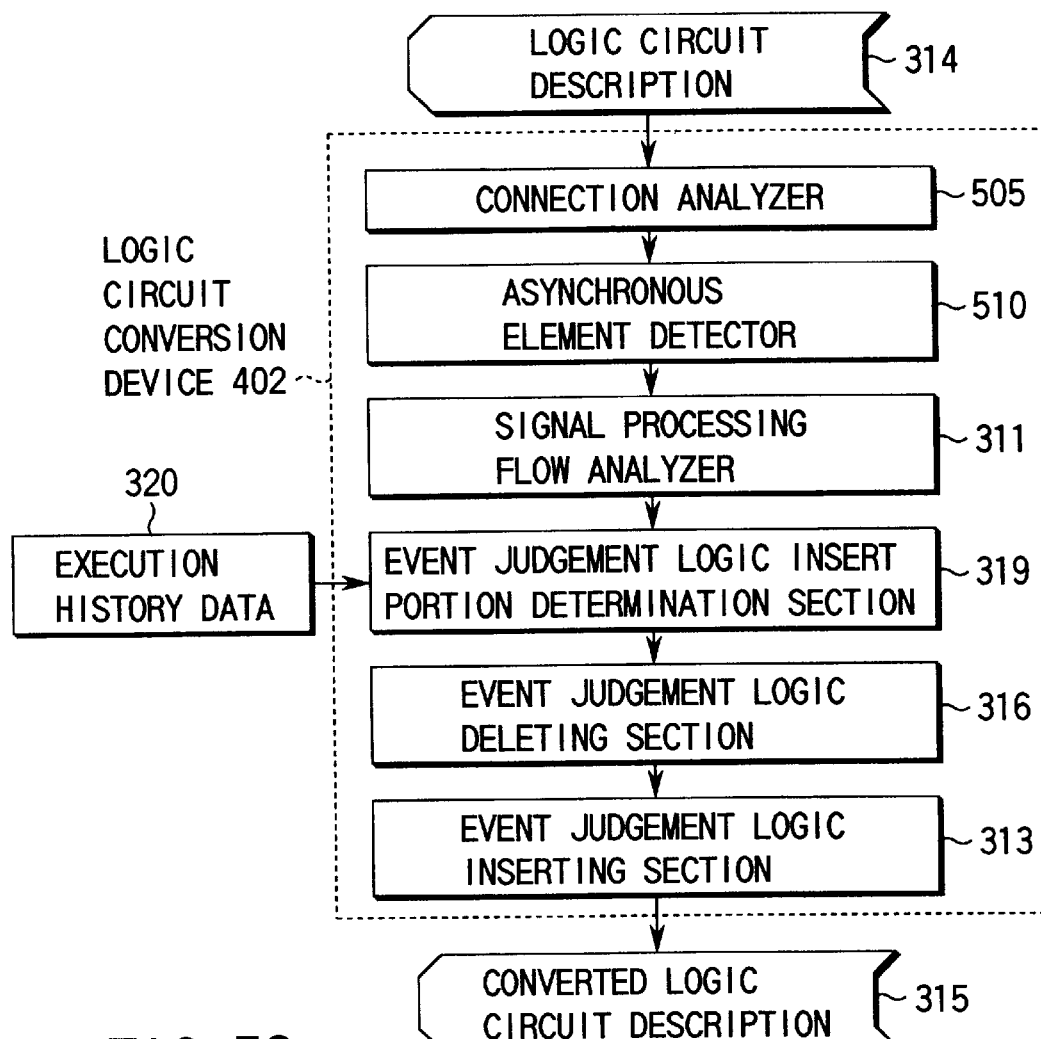
FIG. 59 is a block diagram showing the arrangement of a logic circuit conversion device according to the eighth embodiment of the present invention.
FIG. 60 is a view showing an example of execution history data in the eighth embodiment.
FIG. 61 is a view showing another example of execution history data in the eighth embodiment.

As in a logic circuit conversion device 402 in FIG. 59, therefore, it is expected that a logic circuit conversion result that allows simulation at a higher speed can be obtained by using an event judgment logic insert portion determination section 319 having the function of determining event judgment logic insert portions on the basis of execution history data 320 input by the designer.

Execution history data may be specified by providing history data, for each logic processing unit, indicating whether event execution processing is performed in each simulation cycle, as shown in FIG. 60, or by providing event execution processing frequency data for each logic processing unit, as shown in FIG. 61.

A logic simulation device serving as a logic circuit conversion support device having the logic circuit conversion device according to the eighth embodiment will be described next.

Figure 62:
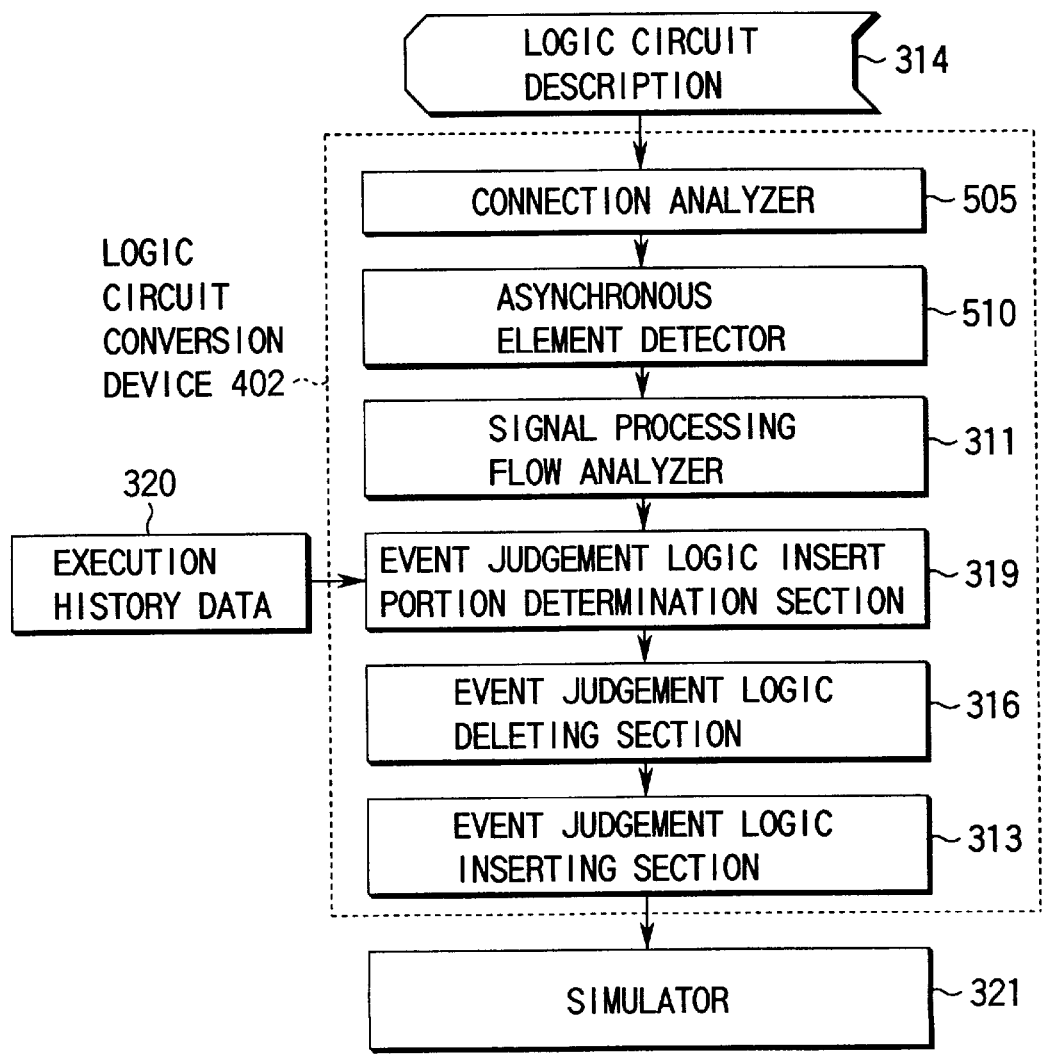
FIG. 62 is a block diagram showing the arrangement of a logic simulation device using the eighth embodiment.

The logic simulation device according to this embodiment comprises a known simulator 321, in addition to the logic circuit conversion device 402 according to the eighth embodiment, as shown in FIG. 62.

(Ninth Embodiment)

If there is execution history data that describes the approximate event occurrence frequency of each signal in the logic circuit description input to the logic circuit conversion device according to the fifth embodiment, it is expected that event judgment logic insert portions can be determined more accurately by using this data.

Figure 63:
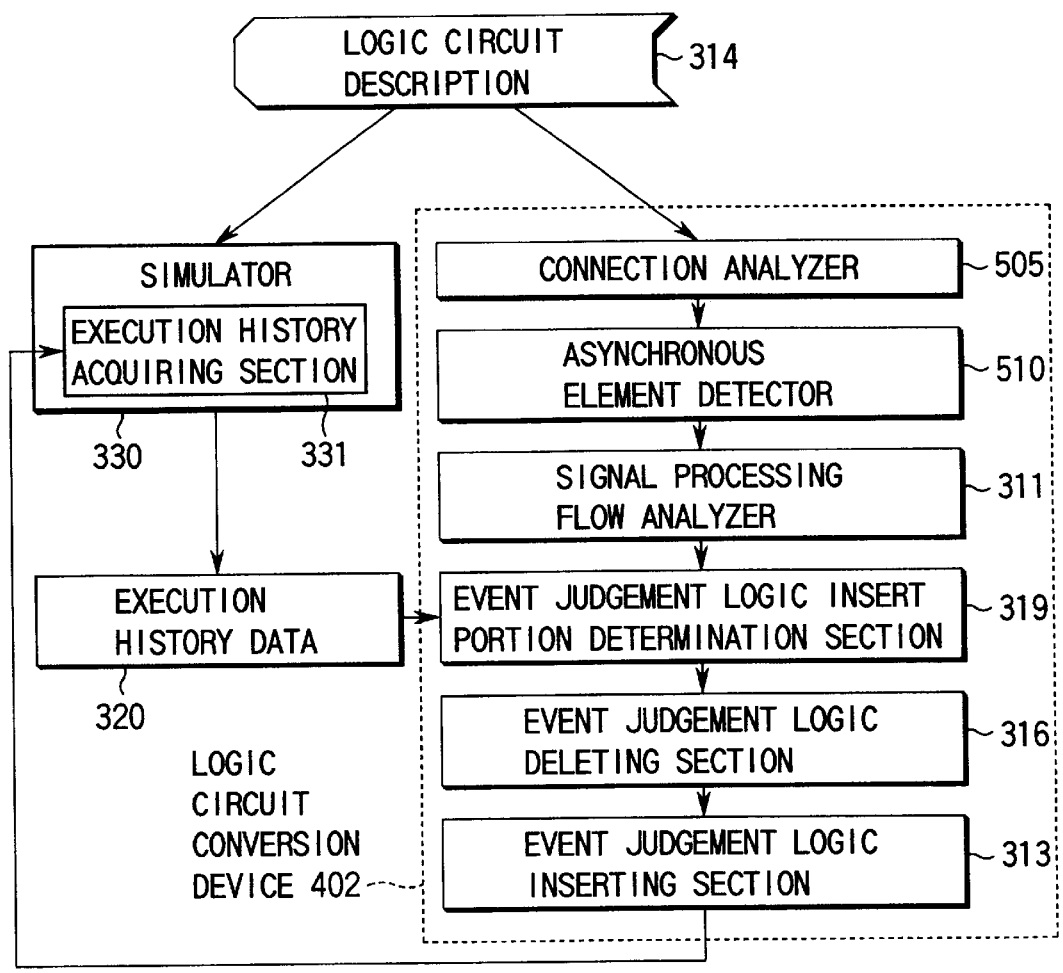
FIG. 63 is a block diagram showing the arrangement of a logic circuit conversion device according to the ninth embodiment of the present invention.

As shown in FIG. 63, therefore, an execution history acquiring section 331 is arranged in a simulator 330. With this arrangement, a logic simulation device formed of the logic circuit conversion device 402 according to the eighth embodiment (FIG. 59) and the simulator 330 can determine event judgment logic insert portions on the basis of execution history data 320 obtained by the execution history acquiring section 331 from a simulation result.

Execution history data can be specified by using one of the methods shown in FIGS. 60 and 61.

According to this embodiment, the event judgment logic insert portions in an input logic circuit description are dynamically changed in accordance with a simulation result, and simulation can be continued.

In the sixth to ninth embodiments, it is possible to use the logic simulation device based on a compiler scheme as in the fifth embodiment.

As has been described above, according to the present invention, an input logic circuit description is analyzed to detect an asynchronous element, and grouping is executed within a limited area excluding the asynchronous element, thereby obtaining a logic circuit requiring a smaller signal processing amount even from the logic circuit including the asynchronous element. By inputting the circuit description obtained by the logic circuit conversion device to the logic simulator, a logic simulation device which reduces the time required for simulation can be realized.

According to the present invention, an input circuit description is simplified as follows. Levels are assigned to the respective event execution units in the ascending order of longest paths from the input side on the basis of the connection relationship in the input logic circuit description. The event execution units are then arranged in the order of the levels and grouped into one event execution unit. In this case, signals to be used to transfer values between event execution units are immediately replaced with variables. According to the circuit description obtained by this operation, a single event execution unit is not repeatedly evaluated within one simulation cycle. In addition, since signal processing associated with the transfer of values between event execution units is replaced with variable processing, high-speed processing can be performed. Furthermore, since the number of event execution units decreases, the number of times an event execution unit is registered in an event queue and a registered event is extracted from the event queue decreases. Even if, therefore, each event execution unit is small in size, and the signal processing amount is large, a circuit that reduces the processing amount required for simulation can be obtained.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, a plurality of embodiments may be properly combined with each other. In addition, the logic circuit conversion device and the logic simulation device according to each embodiment can be realized by executing programs describing the corresponding sequences on a CPU.

What is claimed is:

1. A logic circuit conversion method comprising the following steps of:

detecting circuit connection data of an input logic circuit;

detecting an asynchronous element in the input logic circuit;

determining a grouping area on the basis of an area from which the asynchronous element in the logic circuit is excluded; and grouping the determined area;

wherein:

said circuit connection data detecting step comprises the substep of analyzing an activation relationship between event execution units, which is a connection relationship between the event execution units and signals, said grouping area determining step comprises the following substeps of:

assigning levels to the respective event execution units in the ascending order of longest paths from an input side; and setting the event execution units as grouping candidates in the ascending order of levels, and said grouping step comprises the following substeps of:

grouping the candidates in the ascending order of levels into one event execution unit; and immediately substituting a variable for an input signal between event execution units.

2. A method according to claim 1, in which said grouping area determining step comprises the following substeps of:

specifying an area; and determining a grouping area within the specified area on the basis of the area from which the asynchronous element in the logic circuit is excluded.

3. A method according to claim 1, in which said asynchronous element detecting step comprises a following substep of detecting a latch, a process including a self-loop, a process incapable of logic synthesis, or a process including asynchronous loop.

4. A method according to claim 1, in which said grouping area determining step comprises the following substeps of:

judging a function of each circuit constituent element; and setting constituent elements having the same function in one area.

5. A method according to claim 4, in which said grouping area determining step comprises the following substeps of:

judging whether a function of a circuit constituent element corresponds one of to a register, a clock generating circuit, a latch, and a combination circuit; and excluding the register from the grouping area.

6. A logic circuit conversion method comprising the following steps of:

detecting circuit connection data of an input logic circuit;

detecting an asynchronous element in the input logic circuit;

analyzing a signal processing flow in an area from which the asynchronous element in the logic circuit is excluded;

determining a portion, in the input logic circuit, in which event judgment logic is to be inserted, on the basis of the signal processing flow detection result; and inserting the event judgment logic in the insert portion, in the input logic circuit, which is determined in the step of determining.

7. A method according to claim 6, in which said signal processing flow analyzing step comprises a substep of detecting data of a dependence relationship between a signal and a logic processing unit.

8. A method according to claim 6, in which said portion determining step comprises a substep of determining, as insert portions, start and end portions of a closed group, of logic processing unit groups, which has no path going outside the group and entering the group again and in which the number of times of signal assignment processing is large as compared with the number of input signals.

9. A method according to claim 6, in which said portion determining step comprises the following substeps of:

inputting an event occurrence frequency of each signal; and determining a portion exhibiting a low occurrence frequency as an insert portion.

10. A logic circuit conversion support device comprising:

means for detecting circuit connection data of an input logic circuit;

means for detecting an asynchronous element in the input logic circuit;

means for analyzing a signal processing flow in an area from which the asynchronous element in the logic circuit is excluded;

means for determining a portion, in the input logic circuit, in which event judgment logic is to be inserted, on the basis of the signal processing flow detection result; and means for inserting the event judgment logic in the insert portion, in the input logic circuit, which is determined in the step of determining.

* * * * *